(12) United States Patent
Kang et al.

(10) Patent No.: US 10,761,056 B2
(45) Date of Patent: Sep. 1, 2020

(54) PRODUCING A SEPARATION MEDIUM USING GRAYSCALE MASK

(71) Applicant: The Regents of the University of California, Oakland, CA (US)

(72) Inventors: Chi-Chih Kang, Berkeley, CA (US); Amy E. Herr, Oakland, CA (US); Todd A. Duncombe, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 794 days.

(21) Appl. No.: 15/023,800

(22) PCT Filed: Sep. 24, 2014

(86) PCT No.: PCT/US2014/057274
§ 371 (c)(1),
(2) Date: Mar. 22, 2016

(87) PCT Pub. No.: WO2015/048168
PCT Pub. Date: Apr. 2, 2015

(65) Prior Publication Data
US 2016/0258901 A1    Sep. 8, 2016

Related U.S. Application Data

(60) Provisional application No. 61/881,879, filed on Sep. 24, 2013.

(51) Int. Cl.
*G01N 27/44* (2006.01)
*G03F 1/00* (2012.01)
(Continued)

(52) U.S. Cl.
CPC .... *G01N 27/4476* (2013.01); *B01L 3/502753* (2013.01); *G01N 27/44726* (2013.01);
(Continued)

(58) Field of Classification Search
CPC ......... G01N 27/4476; G01N 27/44782; G01N 27/44739; G01N 27/44747;
(Continued)

(56) References Cited

U.S. PATENT DOCUMENTS 4,790,919 A    12/1988  Baylor, Jr.
4,985,128 A *  1/1991   Ebersole .......... G01N 27/44704
                                                         204/469

(Continued)

FOREIGN PATENT DOCUMENTS

WO    WO2010135364    11/2010
WO    2013071126      5/2013

*Primary Examiner* — Jessica M Roswell
(74) *Attorney, Agent, or Firm* — Rudy J. Ng; Bret E. Field; Bozicevic, Field & Francis LLP

(57) ABSTRACT

Provided are methods for producing a separation medium, where the method includes exposing a separation medium precursor solution to light from a light source through a photomask that includes a region with varied light transmittance to produce the separation medium. Systems that find use in performing the methods, microfluidic devices that include the separation medium, as well as methods of using the microfluidic devices, are also provided. Embodiments of the present disclosure find use in a variety of different applications, including detecting whether an analyte is present in a fluid sample.

7 Claims, 26 Drawing Sheets

(51) Int. Cl.
- *G03F 1/50* (2012.01)
- *G03F 7/20* (2006.01)
- *G01N 27/447* (2006.01)
- *G03F 1/54* (2012.01)
- *B01L 3/00* (2006.01)
- *G03F 1/32* (2012.01)

(52) U.S. Cl.
CPC . *G01N 27/44739* (2013.01); *G01N 27/44747* (2013.01); *G01N 27/44782* (2013.01); *G01N 27/44791* (2013.01); *G03F 1/32* (2013.01); *G03F 1/50* (2013.01); *G03F 1/54* (2013.01); *G03F 7/20* (2013.01); *B01L 2200/10* (2013.01); *B01L 2200/12* (2013.01)

(58) Field of Classification Search
CPC ........ G01N 27/44791; G01N 27/44726; G03F 1/50; G03F 1/32; G03F 7/20; G03F 1/54; B01L 3/502753; B01L 2200/12; B01L 2200/10

See application file for complete search history.

(56) References Cited

U.S. PATENT DOCUMENTS

| | | | |
|---|---|---|---|
| 7,005,050 B2* | 2/2006 | Burns | G01N 27/44704 204/251 |
| 7,909,867 B2 | 3/2011 | Myung et al. | |
| 8,047,829 B1 | 11/2011 | Sommer et al. | |
| 8,524,060 B1 | 9/2013 | Herr et al. | |
| 2004/0132855 A1* | 7/2004 | Kohl | B81C 1/00103 522/150 |
| 2005/0196702 A1* | 9/2005 | Bryant | A61L 27/16 430/311 |
| 2006/0194306 A1 | 8/2006 | Herr et al. | |
| 2007/0245772 A1 | 10/2007 | Lieberman et al. | |
| 2012/0329040 A1 | 12/2012 | Herr et al. | |

* cited by examiner

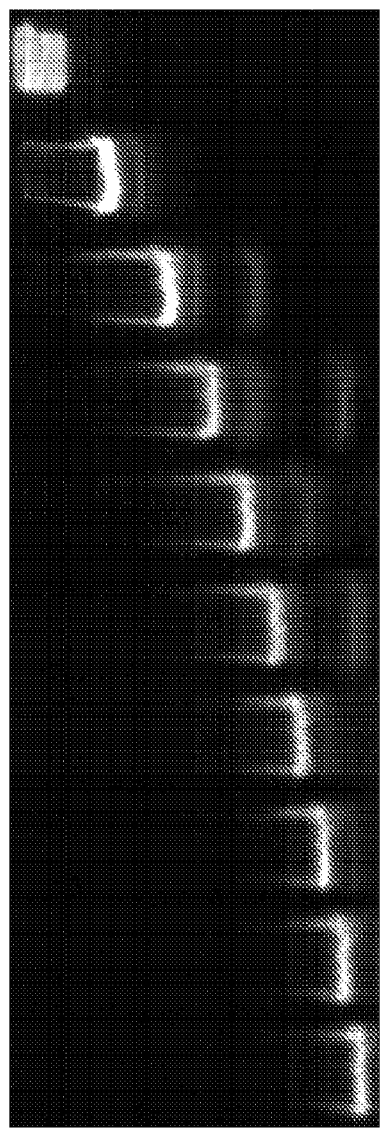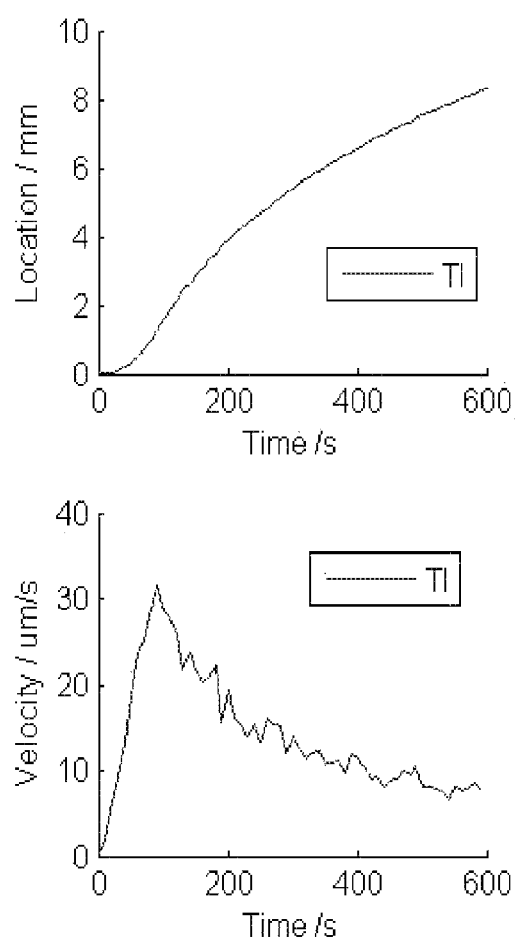
FIG. 10A                              FIG. 10B

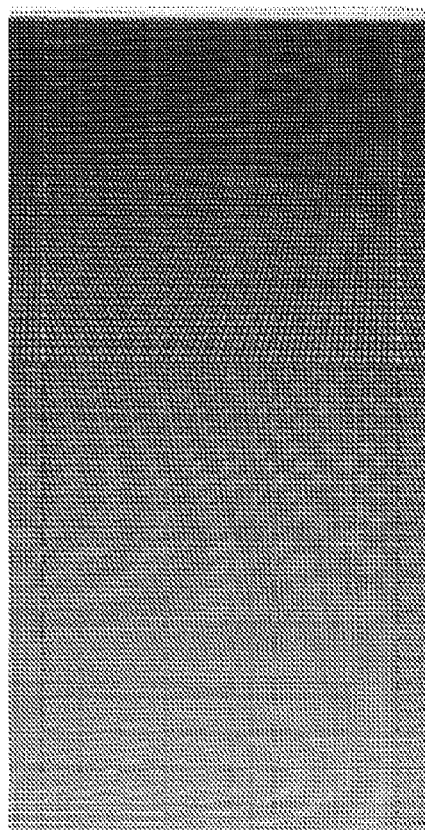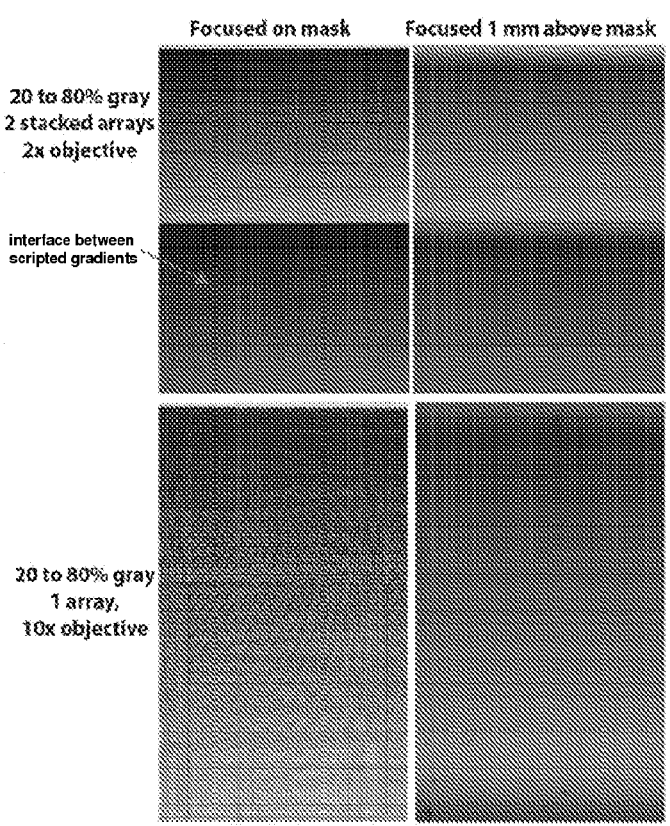
FIG. 14A  FIG. 14B  FIG. 14C

US 10,761,056 B2

PRODUCING A SEPARATION MEDIUM USING GRAYSCALE MASK

CROSS-REFERENCE TO RELATED APPLICATION

Pursuant to 35 U.S.C. § 119(e), this application claims priority to the filing date of U.S. Provisional Application No. 61/881,879, filed on Sep. 24, 2013, the disclosure of which is incorporated herein by reference.

REFERENCE TO GOVERNMENT SUPPORT

This invention was made with government support under grant number 1056035 awarded by the National Science Foundation. The government has certain rights in the invention.

INTRODUCTION

SDS-PAGE (sodium dodecyl sulfate polyacrylamide gel electrophoresis) is a basic tool widely used in biochemistry, cell and molecular biology, and clinical diagnosis to separate proteins on the sole basis of their size. Protein size determination is achieved through binding of SDS molecules to protein, which covers different proteins with identical negative charges per unit mass.

To achieve diverse functions, lab-on-a-chip devices often include hydrogels with spatially varying properties. Integration of these customized hydrogels in microfluidic channel networks has advanced lab-on-a-chip performance. Specifically, non-uniform hydrogels provide an avenue for integration of both preparative and analytical functions (e.g., sample enrichment, high-resolution biomolecular separations, sample immobilization/capture). Current fabrication protocols for spatially varying hydrogels remain inflexible-requiring either precursor exchange steps or long diffusion times to establish monomer gradients. These protocols are inherently slow and constrained to a limited subset of low-to-moderate complexity geometries.

SUMMARY

Provided are methods for producing a separation medium, where the method includes exposing a separation medium precursor solution to light from a light source through a photomask that includes a region with varied light transmittance to produce the separation medium. Systems that find use is performing the methods, microfluidic devices that include the separation medium, as well as methods of using the microfluidic devices, are also provided. Embodiments of the present disclosure find use in a variety of different applications, including detecting whether an analyte is present in a fluid sample.

Embodiments of the present disclosure include a method for producing a spatially varied separation medium. The method includes exposing a separation medium precursor solution to light from a light source through a photomask that includes a region with varied light transmittance to produce the separation medium.

In some embodiments, the region with varied light transmittance is semi-transparent.

In some embodiments, the method further includes directing the light from the light source through a light diffuser between the photomask and the separation medium precursor solution.

In some embodiments, the photomask includes two or more regions having a different light transmittance.

In some embodiments, a region of the photomask has a light transmittance ranging from 10% and 90%.

In some embodiments, a region of the photomask has a light transmittance ranging from 40% and 90%.

In some embodiments, the photomask has a linear gradient of light transmittance from 0% to 100%.

In some embodiments, the photomask has a linear gradient of light transmittance from 10% to 90%.

In some embodiments, the separation medium precursor solution includes an acrylamide monomer, a crosslinker and a photoinitiator.

Aspects of the present disclosure also include a separation medium produced by the method disclosed herein.

Aspects of the present disclosure also include a microfluidic device that includes a support, and a separation medium associated with the support and configured to separate a sample along a directional axis, where the separation medium has a homogeneous composition and includes regions having different degrees of polymerization.

In some embodiments, the separation medium includes a polymeric gel.

In some embodiments, the separation medium includes a contiguous polymeric gel monolith having regions with different densities.

In some embodiments, the separation medium has a linear density gradient.

Aspects of the present disclosure also include a system for producing a separation medium. The system includes a support configured to contain a separation medium precursor solution, a photomask that includes a semi-transparent region, and a light source configured to direct a light from the light source to the separation medium precursor solution through the photomask.

In some embodiments, the photomask includes two or more regions having a different light transmittance.

In some embodiments, the system further includes a light diffuser between the support and the photomask. In some embodiments, a light diffuser is not present between the support and the photomask.

In some embodiments, the support includes a gasket on a surface of the support configured to contain the separation medium precursor solution.

In some embodiments, the support includes a microchannel configured to contain the separation medium precursor solution.

Aspects of the present disclosure also include a method of detecting an analyte in a sample. The method includes introducing a fluid sample into the separation medium of the microfluidic device described herein, directing the sample through the separation medium to produce a separated sample, and detecting the analyte in the separated sample.

In some embodiments, the directing includes applying an electric field to the separation medium.

Aspects of the present disclosure also include a kit that includes a microfluidic device as disclosed herein, and a packaging containing the microfluidic device.

BRIEF DESCRIPTION OF THE FIGURES

FIG. 3A shows a separation gel fabricated with 96 separation lanes within the area of a 96 well plate. Each sample reservoir was spaced 9 mm which faciliated sample delivery using a multi-channel pipette. FIG. 3B shows a CAD image of the grayscale mask as compared to a fabricated gradient gel containing a fluorescent acrylamide monomer. The apparent nonuniformity was caused by non-uniformity in the imaging system. FIG. 3C shows a 96-plex SDS PAGE gradient gel separation that was performed in 4 minutes using four fluorescently labeled species: Bovine Serum Albumin (BSA, 65 kDa, rows 2,7), Ovalbumin (OVA, 45 kDa, rows 1,8), Trypson Inhibitor (TI, 21 kDa, row 5), Parvalbumin (PARV, 12 kDa, row 4), and a ladder containing all four—in rows 3 and 6. FIG. 3D shows a gradient gel array that prevented contamination from one lane to the next; 5 contiguous ladder separations in the gradient gel are shown compared to separations in a uniform 20% gel. In the gradient gel, samples were uncontaminated for a 15 minute separation—while in the uniform gel lane contamination can be seen as early as 4 minutes.

FIG. 6A (top)) and a 25% grayscale pattern (i.e., 75% transmittance; FIG. 6A (bottom)).

FIG. 10A shows a series of fluorescent images over time of a gradient separation media produced according to the methods disclosed herein. FIG. 10B shows a graph (FIG. 10B, top) of the corresponding location (mm) vs. time (s), and (FIG. 10B, bottom) of velocity (μm/s) vs. time (s) for the sample fluorescent protein.

FIG. 11C (bottom) shows an enlargement of an image of light transmitted through a 20% grayscale mask with a diffuser, showing a significant reduction in pixilation.

FIG. 13 (bottom) shows a drawing of an example of a 5% to 95% linear gradient grayscale mask.

FIG. 14A shows an image of a 20% to 80% chrome linear gradient grayscale mask for 1 mm spatial patterning, according to embodiments of the present disclosure. FIG. 14B (top) shows an image of two 20% to 80% grayscale masks with the image taken through a 2× objective lens and focused on the masks. FIG. 14B (bottom) shows an image of one 20% to 80% grayscale mask with the image taken through a 10× objective lens and focused on the mask. FIG. 14C (top) shows an image of two 20% to 80% grayscale masks with the image taken through a 2× objective lens and focused 1 mm above the masks. FIG. 14C (bottom) shows an image of one 20% to 80% grayscale mask with the image taken through a 10× objective lens and focused 1 mm above the mask.

FIG. 18 (top right) shows a fluorescence image of analyte migration through a 20% T uniform PAG. FIG. 18 (bottom left) shows a graph of velocity ($\mu$m/s) vs. time (s) for the 90% to 10% gradient PAG, and FIG. 18 (bottom right) shows a graph of velocity ($\mu$m/s) vs. location ($\mu$m) for the 90% to 10% gradient PAG. Dotted lines indicate the corresponding values for uniform PAGs with the % T as indicated.

DETAILED DESCRIPTION

Figure 1:
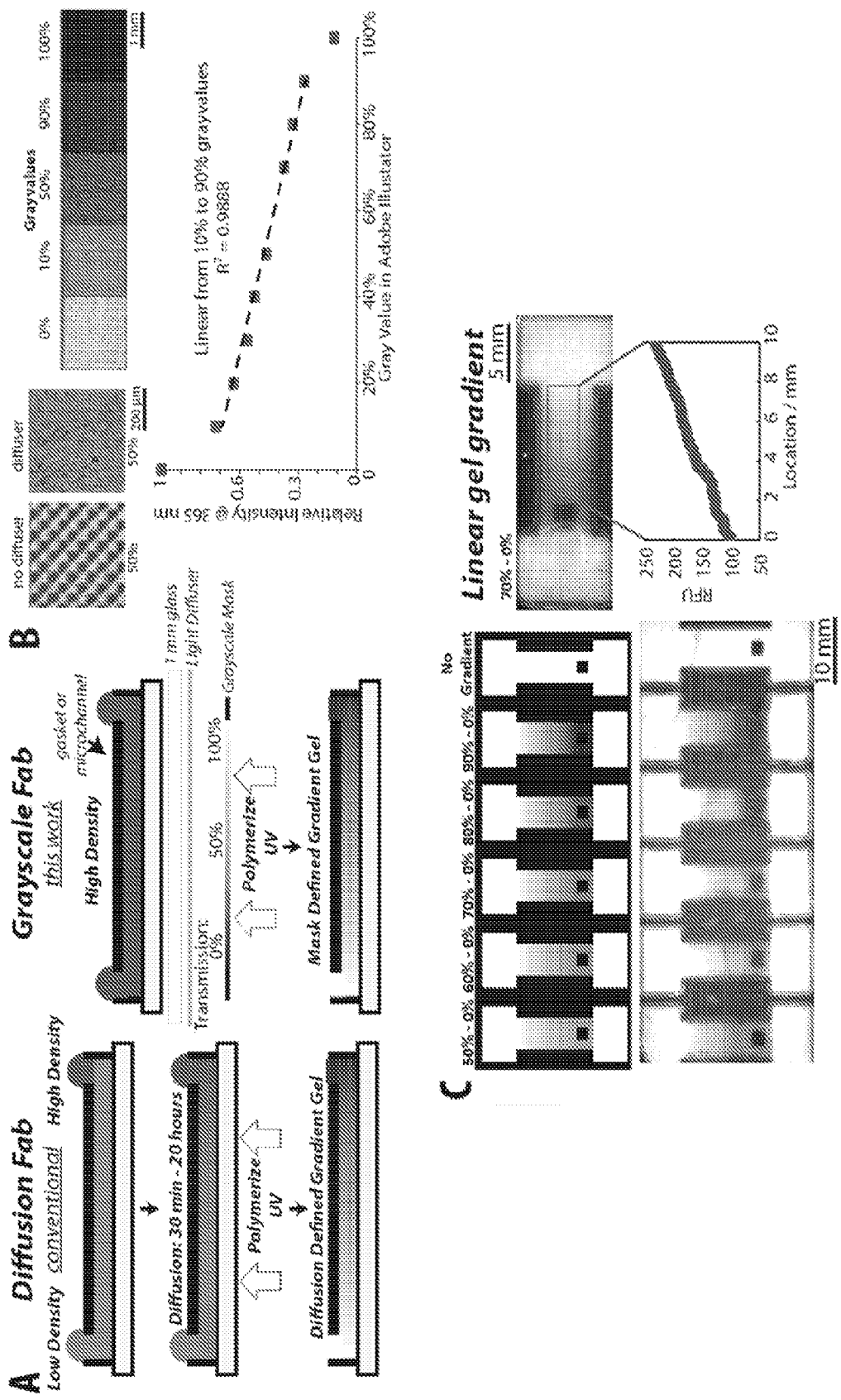
FIG. 1A shows a schematic of direct gradient gel photopatterning with a grayscale mask, which provides for a high throughput and design flexible alternative to diffusion based gradient gel fabrication.
FIG. 1B shows images demonstrating that by inserting a photography light diffuser (Rosco P #3010) between the grayscale mask and the precursor solution, low resolution dots were reduced from laser printed grayscale masks. The grayscale laser-printed mask/light diffuser exposure setup was able to predictably attenuate UV light over a large range of relative values, such as from 0% to 100%.
FIG. 1C shows images of gradient gel formation that was monitored for several gradient slopes by adding a fluorescent acrylamide monomer to access relative monomer incorporation at different positions along the grayscale mask.

Provided are methods for producing a separation medium, where the method includes exposing a separation medium precursor solution to light from a light source through a photomask that includes a region with varied light transmittance to produce the separation medium. Systems that find use is performing the methods, microfluidic devices that include the separation medium, as well as methods of using the microfluidic devices, are also provided. Embodiments of the present disclosure find use in a variety of different applications, including detecting whether an analyte is present in a fluid sample.

Before the present invention is described in greater detail, it is to be understood that aspects of the present disclosure are not limited to the particular embodiments described, and as such may, of course, vary. It is also to be understood that the terminology used herein is for the purpose of describing particular embodiments only, and is not intended to be limiting, since the scope of embodiments of the present disclosure will be defined only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within embodiments of the present disclosure. The upper and lower limits of these smaller ranges may independently be included in the smaller ranges and are also encompassed within embodiments of the present disclosure, subject to any specifically excluded limit in the stated range. Where the stated range includes one or both of the limits, ranges excluding either or both of those included limits are also included in embodiments of the present disclosure.

Unless defined otherwise, all technical and scientific terms used herein have the same meaning as commonly understood by one of ordinary skill in the art to which this invention belongs. Although any methods and materials similar or equivalent to those described herein can also be used in the practice or testing of embodiments of the present disclosure, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that embodiments of the present disclosure are not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Below, the subject microfluidic devices are described first in greater detail. Methods of detecting an analyte in a fluid sample are also disclosed in which the subject microfluidic devices find use. In addition, systems and kits that include the subject microfluidic devices are also described.

Methods

Aspects of the present disclosure include a method of producing a separation medium. In certain embodiments, the method includes exposing a separation medium precursor solution to light from a light source through a photomask that includes a region with varied light transmittance to produce a separation medium. A photomask (also referred to as a "mask" herein) is a transparent or semi-transparent substrate that may be positioned between the light source and the precursor solution of the separation medium and/or the separation medium that is formed. In some embodiments, the photomask is positioned between the light source and the precursor solution of the separation medium. Light may be transmitted from the light source through the photomask and to the precursor solution of the separation medium to form the separation medium from the precursor solution. For instance, the precursor solution of the separation medium may include precursor moieties that are activated by light from the light source to form the separation medium. In some cases, as described in more detail below, the precursor moieties include a monomer (e.g., a light activated monomer) that polymerizes upon exposure to light to form the separation medium.

In certain instances, the photomask includes a region with varied light transmittance. By "varied light transmittance" is meant that the photomask includes one or more regions that have different transmittance values within the region or between different regions of the photomask. For example, the photomask can include two or more regions, such as a first region and a second region, where the first region has a first transmittance, and a second region that has a second transmittance different from the first region. In some instances, the photomask includes a region that has different transmittance values within the same region. For instance, the photomask may include a region where the transmittance varies within the same region, such as a region where the transmittance varies gradually across the region. In some cases, a region where the transmittance varies gradually across the region is referred to as a gradient photomask. By "gradient photomask" is meant that the photomask has a region of low light transmission and a region of high light transmission with an increasing light transmission from the region of low light transmission to the region of high light transmission. In some instances, the gradient of light transmission is a linear gradient, such that the light transmission of the gradient photomask increases linearly from the region of low light transmission to the region of high light transmission.

In certain embodiments, the photomask is a contiguous substrate. For example, the photomask may be a contiguous substrate such that there are no voids (e.g., holes or unmasked areas) in the substrate. In these embodiments, light from the light source is transmitted through the substrate of the photomask before contacting the separation medium precursor solution and/or the separation medium, and does not directly contact the separation medium precursor solution and/or the separation medium without being transmitted through the substrate of the photomask.

In certain embodiments, a region of the photomask with varied light transmittance is a region that is semi-transparent. By "semi-transparent" is meant a material that has a light transmittance between 0% and 100%. For example, a semi-transparent photomask may have a light transmittance of less than 100%, such as 90% or less, or 80% or less, or 70% or less, or 60% or less, or 50% or less, or 40% or less, or 30% or less, or 20% or less, or 10% or less. Stated another way, a semi-transparent photomask may have a light transmittance of greater than 0%, such as 10% or more, or 20% or more, or 30% or more, or 40% or more, or 50% or more, or 60% or more, or 70% or more, or 80% or more, or 90% or more. In some instances, the semi-transparent photomask has a light transmittance between 0% and 100%, such as from 10% to 90%, including from 20% to 80%, or from 30% to 70%, or from 40% to 60%. Other ranges are also contemplated, such as a light transmittance ranging from 10% to 90%, or 20% to 90%, or 30% to 90%, or 40% to 90%, or 50% to 90%, or 60% to 90%, or 70% to 90%, or 80% to 90%, etc.

In certain instances, a photomask that includes a semi-transparent region is called a "grayscale mask", which, as described above, is configured to modulate light transmittance to control the spatial exposure dose of light onto a substrate or material, such as a separation medium precursor solution. A grayscale mask may have a light transmittance ranging from 0% to 100%, or any value between 0% and 100%. For example, a grayscale mask may include a semi-transparent region that has a light transmittance between 0% and 100%, such as ranging from 10% to 90%, including from 20% to 80%, or from 30% to 70%, or from 40% to 60%. In some instances, the grayscale mask has a uniform light transmittance over substantially the entire mask, such as a light transmittance of 10%, or 20%, or 30%, or 40%, or 50%, or 60%, or 70%, or 80%, or 90%, or a value in between those listed above.

In certain embodiments, the grayscale mask is a gradient mask, such that the grayscale mask has a gradient of light transmittance. By "gradient of light transmittance" is meant that the mask has a region of low light transmission and a region of high light transmission with an increasing light transmission from the region of low light transmission to the region of high light transmission. In some instances, the gradient is a linear gradient, such that the light transmission of the mask increases linearly from the region of low light transmission to the region of high light transmission. The region of low light transmission may have a percent transmittance of any value described herein, and similarly the region of high light transmittance may have any value described herein that is a different value from the region of low light transmittance. For example, a gradient mask may have a gradient of light transmittance from 0% to 100% (i.e., a gradient from a region of 0% transmittance to a region of 100% transmittance), such as a gradient of light transmittance from 5% to 95%, or 10% to 90%, or 15% to 85%, or 20% to 80%, or 25% to 75%, or 30% to 70%, or 35% to 65%, or 40% to 60%. Other gradient ranges are also possible, such as a gradient range from 0% to 25%, or 25% to 45%, or 45% to 75%, or 75% to 100%, or 1% to 70%, etc.

In certain embodiments, the grayscale mask may be described in terms of a percent grayscale, which corresponds to the percentage of light blocked by the grayscale mask. For example, a grayscale mask with a 100% grayscale transmits 0% light, and a grayscale mask with a 0% grayscale transmits, 100% light. Similarly, a grayscale mask with a 10% grayscale transmits 90% light, a grayscale mask with a 20% grayscale transmits 80% light, a grayscale mask with a 30% grayscale transmits 70% light, a grayscale mask with a 40% grayscale transmits 60% light, a grayscale mask with a 50% grayscale transmits 50% light, a grayscale mask with a 60% grayscale transmits 40% light, a grayscale mask with a 70% grayscale transmits 30% light, a grayscale mask with a 80% grayscale transmits 20% light, and a grayscale mask with a 90% grayscale transmits 10% light, etc.

In certain embodiments, a grayscale mask is produced by providing a pattern of opaque regions on an optically transmissive substrate. For example, the pattern of opaque regions may include an opaque material provided on a surface of the substrate in a regular pattern. The pattern of opaque regions may have inter-region areas that do not include the opaque material in the inter-region areas. The amount of area covered by the opaque regions per unit area of substrate determines the percent grayscale of the photomask. For example, regions that have a higher percentage per unit area covered with the pattern of opaque material have a higher percent grayscale as compared to regions that have a lower percentage per unit area covered with the pattern of opaque material. In some instances, the pattern of opaque material is arranged in a grid pattern on the surface of the optically transmissive substrate.

Figure 6A:
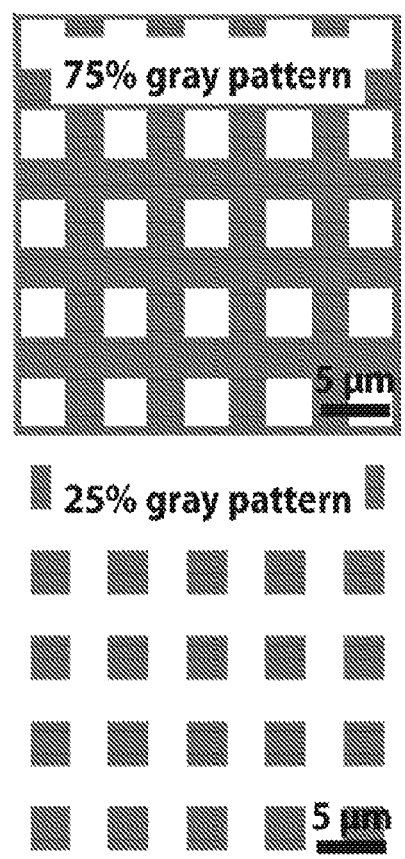
FIG. 6A shows a schematic drawing of a grayscale photomask that includes a grid pattern of opaque material (shaded regions) on an optically transmissive substrate (white regions) for a 75% grayscale pattern (i.e., 25% transmittance.
Figure 6B:
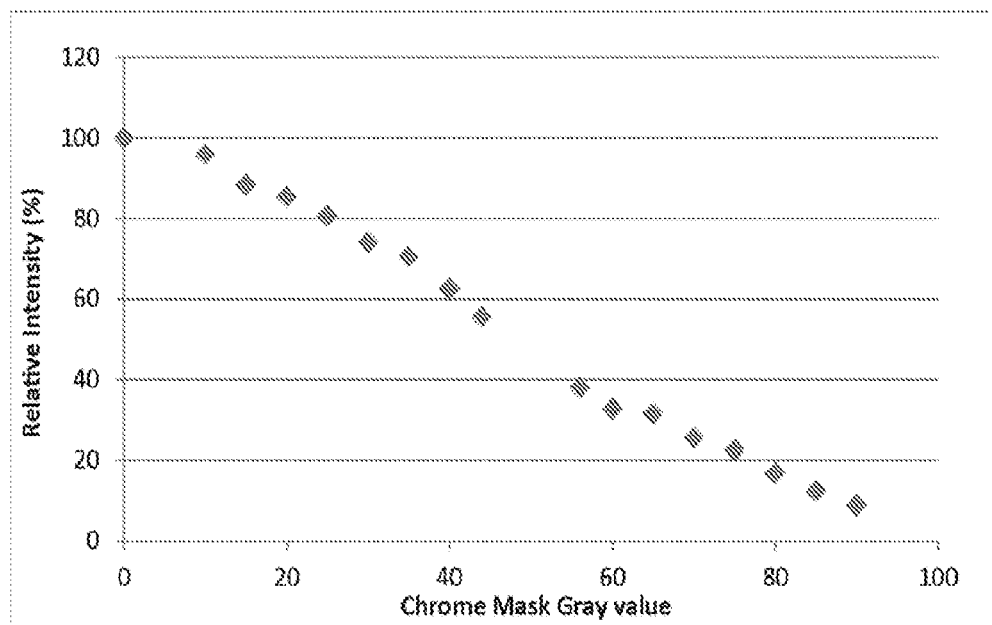
FIG. 6B shows a graph of relative intensity of transmitted light (% transmittance) vs. grayscale mask value (% grayscale).
Figure 6C:
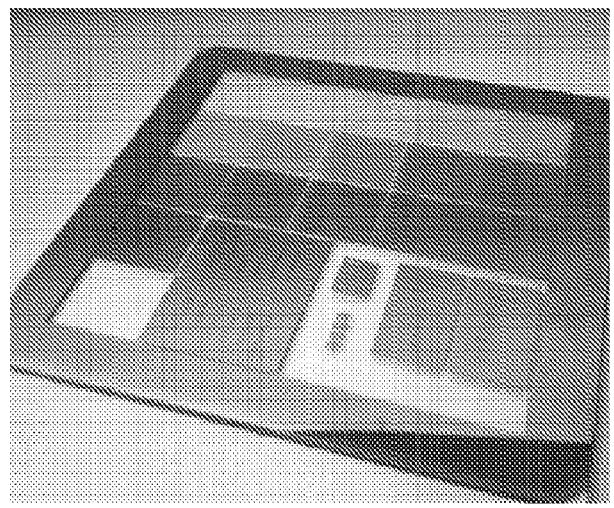
FIG. 6C shows an image of a photo mask that includes regions of different grayscales produced on an optically transparent substrate.

FIG. 6A shows a schematic drawing of a grayscale photomask that includes a grid pattern of opaque material (shaded regions) on an optically transmissive substrate (white regions) for a 75% grayscale pattern (i.e., 25% transmittance; FIG. 6A (top)) and a 25% grayscale pattern (i.e., 75% transmittance; FIG. 6A (bottom)). FIG. 6B shows a graph of relative intensity of transmitted light (% transmittance) vs. grayscale mask value (% grayscale). As shown in FIG. 6B, the grayscale mask has a relative intensity (i.e., transmittance) that varies substantially linearly. FIG. 6C shows an image of a photomask that includes regions of different grayscales produced on an optically transparent substrate. The grayscale masks have different percent transmittances, as shown by the intensity of light transmitted through the different regions of the photomask.

In certain embodiments, the photomask includes one or more (e.g., two or more) distinct regions having different light transmittances. Each distinct region may have a light transmittance ranging from 0% to 100%, or any value between 0% and 100%, such as ranging from 10% to 90%, including from 20% to 80%, or from 30% to 70%, or from 40% to 60%. In certain cases, one or more of the distinct regions is semi-transparent as described above, e.g., has a light transmittance between 0% and 100%, such as ranging from 10% to 90%, such as ranging from 10% to 90%, including from 20% to 80%, or from 30% to 70%, or from 40% to 60%. In certain cases, one or more of the distinct regions has a gradient of light transmittance as described above. The distinct regions having different light transmittances may be adjacent one another or may be separated by inter-region areas. The inter-region areas may also have a light transmittance that is different from the distinct regions. For instance, the inter-region areas may have a light transmittance of 0%, or may have a light transmittance of 100%.

In certain embodiments, the intensity of the light that contacts the separation medium precursor solution and/or the separation medium is modulated by the photomask depending on the transmittance value(s) of the photomask as described above. In some cases, transmitting light through the photomask modulates the light intensity that contacts different regions of the separation medium precursor solution. For instance, transmitting light through the photomask may attenuate the light intensity that contacts regions of the separation medium precursor solution depending on the transmittance value(s) of the photomask. Regions of the photomask with a relatively high transmittance may initiate more polymerization in the regions of the separation medium precursor solution exposed to the higher light intensity, and thus produce a separation medium in that region with a higher density (e.g., a lower porosity). Regions of the photomask with a relatively lower transmittance may initiate less polymerization in the regions of the separation medium precursor solution exposed to the lower light intensity, and thus produce a separation medium in that region with a lower density (e.g., a higher porosity). As described in more detail below, the density (e.g., porosity) of the separation medium may depend on the intensity of light that contacts the separation medium precursor solution to initiate formation of the separation medium. As described herein, the intensity of the light that contacts the precursor solution may be modulated using a grayscale mask as described herein.

Figure 7A:
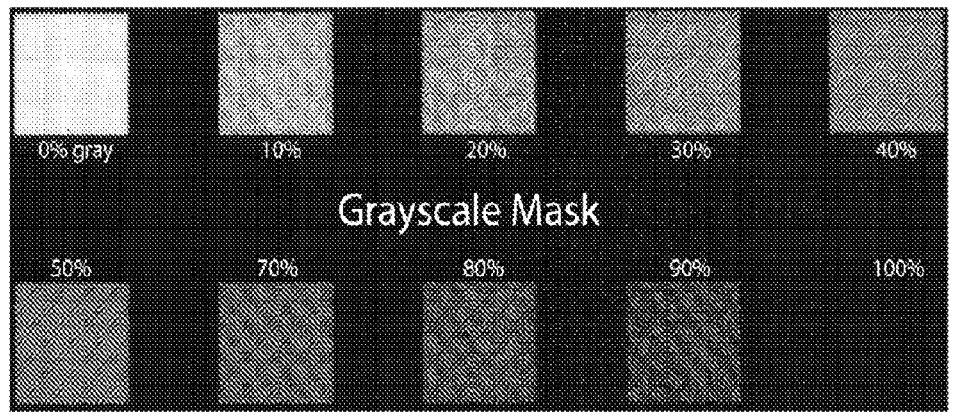
FIG. 7A shows an image of various grayscale masks ranging from 0% grayscale (i.e., 100% transmittance) to 100% grayscale (i.e., 0% transmittance) according to embodiments of the present disclosure.
Figure 7B:
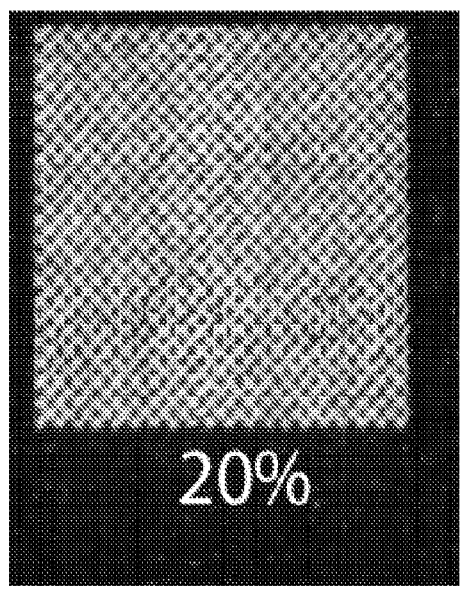
FIG. 7B shows a 20% grayscale mask enlarged to show the grid pattern of opaque material on the optically transmissive substrate.
Figure 7C:
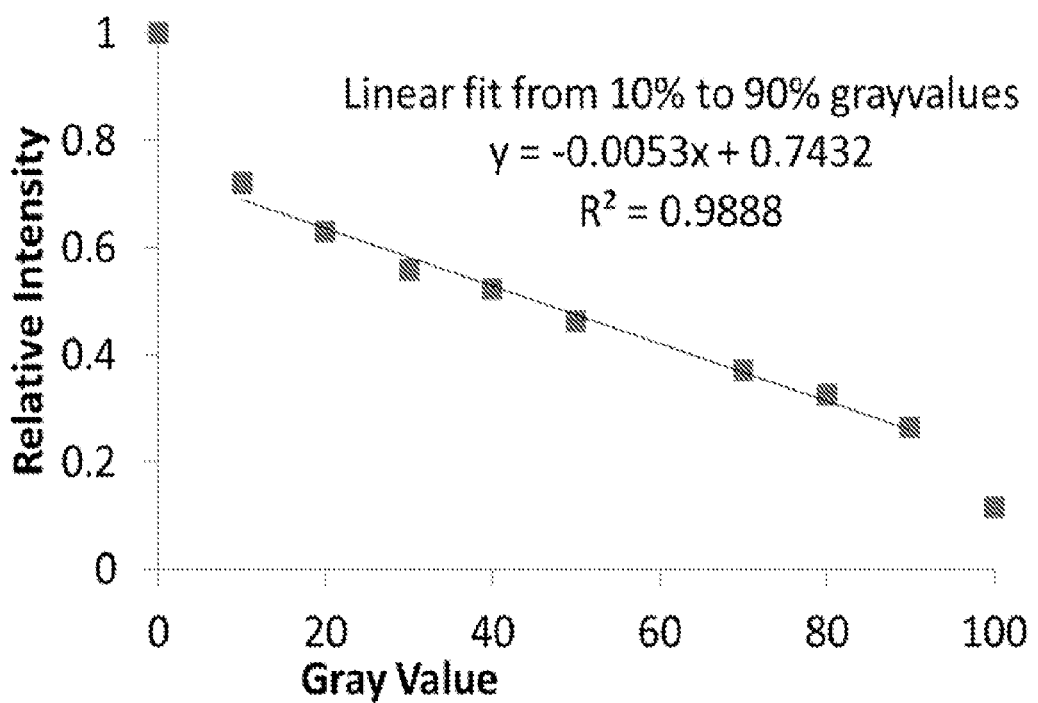
FIG. 7C shows a graph of relative intensity of light transmitted through a grayscale mask vs. grayscale value (% grayscale).

FIG. 7A shows an image of various grayscale masks ranging from 0% grayscale (i.e., 100% transmittance) to 100% grayscale (i.e., 0% transmittance) according to the present disclosure. FIG. 7B shows a 20% grayscale mask enlarged to show the grid pattern of opaque material on the optically transmissive substrate. FIG. 7C shows a graph of relative intensity of light transmitted through a grayscale mask vs. grayscale value (% grayscale). As shown in FIG. 7C, the relative intensity varies linearly with the grayscale value.

In certain embodiments, the method of producing a spatially varied separation medium minimizes the process steps and/or time needed to produce the separation medium. For example, a typical process for producing a separation medium that includes two or more regions of different densities (e.g., porosities) may include multiple steps where a first precursor solution is introduced into a microchannel or chamber, the first precursor solution is polymerized in a first area, the first precursor solution is removed from the microchannel or chamber, a second precursor solution is introduced into the microchannel or chamber, the second precursor solution is polymerized in a second area, etc. As described herein, methods of the present disclosure produce a spatially varied separation medium by exposing different regions of the separation medium precursor solution to different light intensities at the same time (e.g., in a single step) by transmitting the light through a photomask as described herein. In addition, a typical process for producing a gradient separation medium includes providing a first precursor solution in one area of a microchannel or chamber and providing a second precursor solution in a second area of a microchannel or chamber and waiting a period of time for a gradient to develop by diffusion of the first and second precursor solutions through the microchannel or chamber; a process that may take up to 20 hours for the appropriate gradient to form. As described herein, methods of the present disclosure produce a gradient separation medium by exposing a region of the separation medium precursor solution to a gradient of light intensities (e.g., in a single step) by transmitting the light through a gradient photomask as described herein. In addition, embodiments of the present disclosure include the production of a spatially varied separation medium from a light source without the need to vary the intensity of the light source. As described herein methods of the present disclosure produce a spatially varied separation medium by exposing different regions of the separation medium precursor solution to different light intensities (e.g., in a single step) by transmitting the light through a photomask as described herein.

Figure 11A:
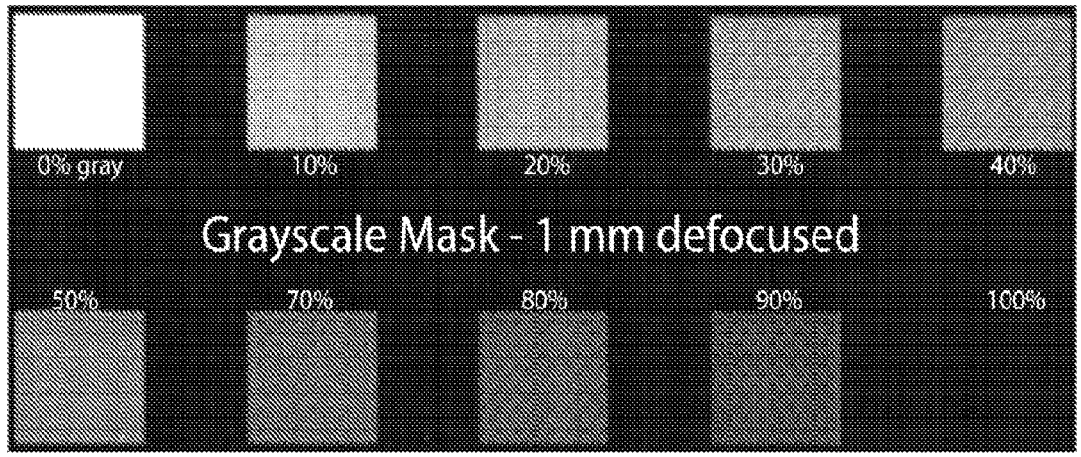
FIG. 11A shows images of light transmitted through various grayscale masks without using a diffuser for grayscale masks of 0% grayscale, 10% grayscale, 20% grayscale, 30% grayscale, 40% grayscale, 50% grayscale, 60% grayscale, 70% grayscale, 80% grayscale, 90% grayscale, and 100% grayscale.
Figure 11B:
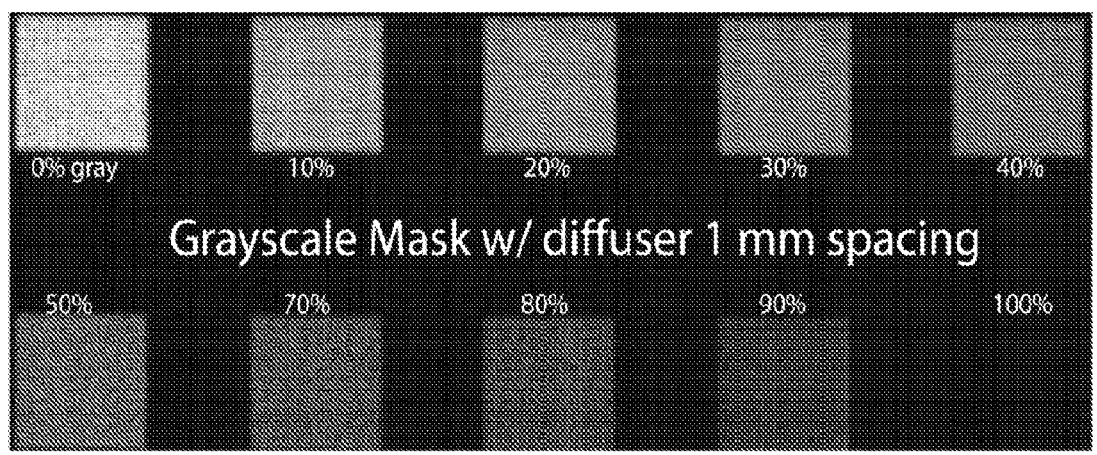
FIG. 11B shows images of light transmitted through various grayscale masks using a diffuser for grayscale masks of 0% grayscale, 10% grayscale, 20% grayscale, 30% grayscale, 40% grayscale, 50% grayscale, 60% grayscale, 70% grayscale, 80% grayscale, 90% grayscale, and 100% grayscale. The grayscale mask to diffuser spacing was 1 mm.
Figure 11C:
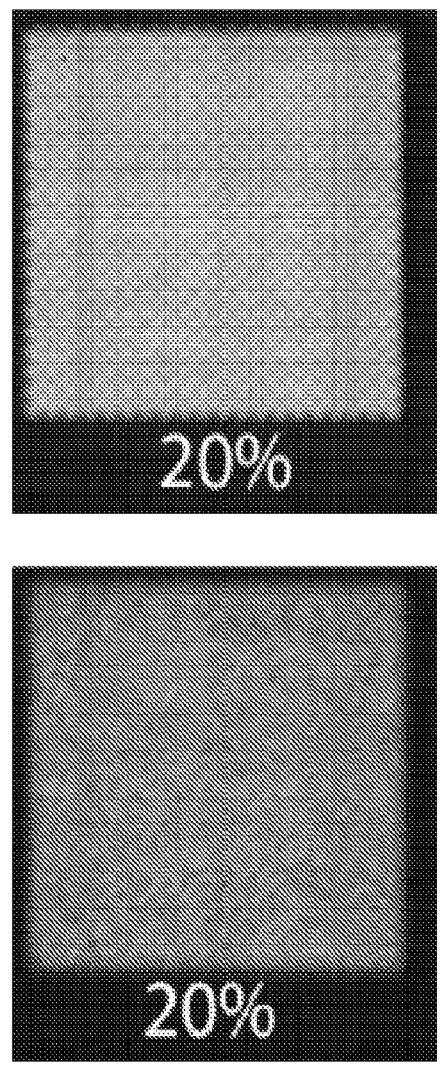
FIG. 11C (top) shows an enlargement of an image of light transmitted through a 20% grayscale mask without a diffuser, showing pixilation of the grayscale mask.

In certain embodiments, the method includes providing a light diffuser between the photomask and the separation medium precursor solution. In some instances, the method includes directing light from the light source through a light diffuser between the photomask and the separation medium precursor solution. In some instances, the light diffuser is configured to diffuse or spread out light transmitted through the photomask before the light contacts the separation medium precursor solution. As described above, in some instances, the photomask may include a pattern (e.g., a grid pattern) of an opaque material on a surface of an optically transmissive substrate, which may in some cases produce pixilation of the light that is transmitted through the photomask. In some instances, the pixilation of the light that is transmitted through the photomask is reduced by passing the light through a light diffuser before the light contacts the separation medium precursor solution. FIG. 11A shows images of light transmitted through various grayscale masks without using a diffuser for grayscale masks of 0% grayscale, 10% grayscale, 20% grayscale, 30% grayscale, 40% grayscale, 50% grayscale, 60% grayscale, 70% grayscale, 80% grayscale, 90% grayscale, and 100% grayscale. FIG. 11B shows images of light transmitted through various grayscale masks using a diffuser for grayscale masks of 0% grayscale, 10% grayscale, 20% grayscale, 30% grayscale, 40% grayscale, 50% grayscale, 60% grayscale, 70% grayscale, 80% grayscale, 90% grayscale, and 100% grayscale. The grayscale mask to diffuser spacing was 1 mm. FIG. 11C (top) shows an enlargement of an image of light transmitted through a 20% grayscale mask without a diffuser, showing pixilation of the grayscale mask. FIG. 11C (bottom) shows an enlargement of an image of light transmitted through a 20% grayscale mask with a diffuser, showing a significant reduction in pixilation.

In certain embodiments, a light diffuser is not present between the photomask and the separation medium precursor solution. For example, the photomask may be configured such that at certain distances between the photomask and the gel precursor solution, a light diffuser is not required to minimize pixilation of light transmitted through the grayscale mask. For instance, the size and/or spacing of the opaque features of a grayscale mask may be determined by the following formulae in order to minimize pixilation of light transmitted through the grayscale mask. For >0% to 25% grayscale, $(X_{min})^2/(X_{array})^2$=grayscale. For 25% to 45% grayscale, $(X_{array}-X_{min})^2/(X_{array})^2$=grayscale. For 45% to 75% grayscale, $(X_{array})^2-(X_{varied})^2/(X_{array})^2$=grayscale. For 75% to <100% grayscale, $(X_{array})^2-(X_{min})^2/(X_{array})^2$=grayscale. $X_{varied}$ is a defined linear function; $X_{varied}$(at grayscale=0.45)=$2*X_{min}$, and $X_{varied}$(at grayscale=0.75)=$X_{min}$. In addition, $X_{array}=X_{min}+X_{varied}$, with 0<grayscale <1. See also, Example 3 and FIG. 13. In certain embodiments, the distance between the photomask and the gel precursor solution is 10 cm or less, such as 5 cm or less, or 2 cm or less, or 1 cm or less, or 7 mm or less, or 5 mm or less, or 3 mm or less, or 2 mm or less, or 1 mm or less. In certain cases, the photomask is configured to minimize pixilation of light transmitted through the grayscale mask at a distance of 1 mm between the photomask and the gel precursor solution. In some cases, a light diffuser is not present between the photomask and the gel precursor solution.

Figure 4:
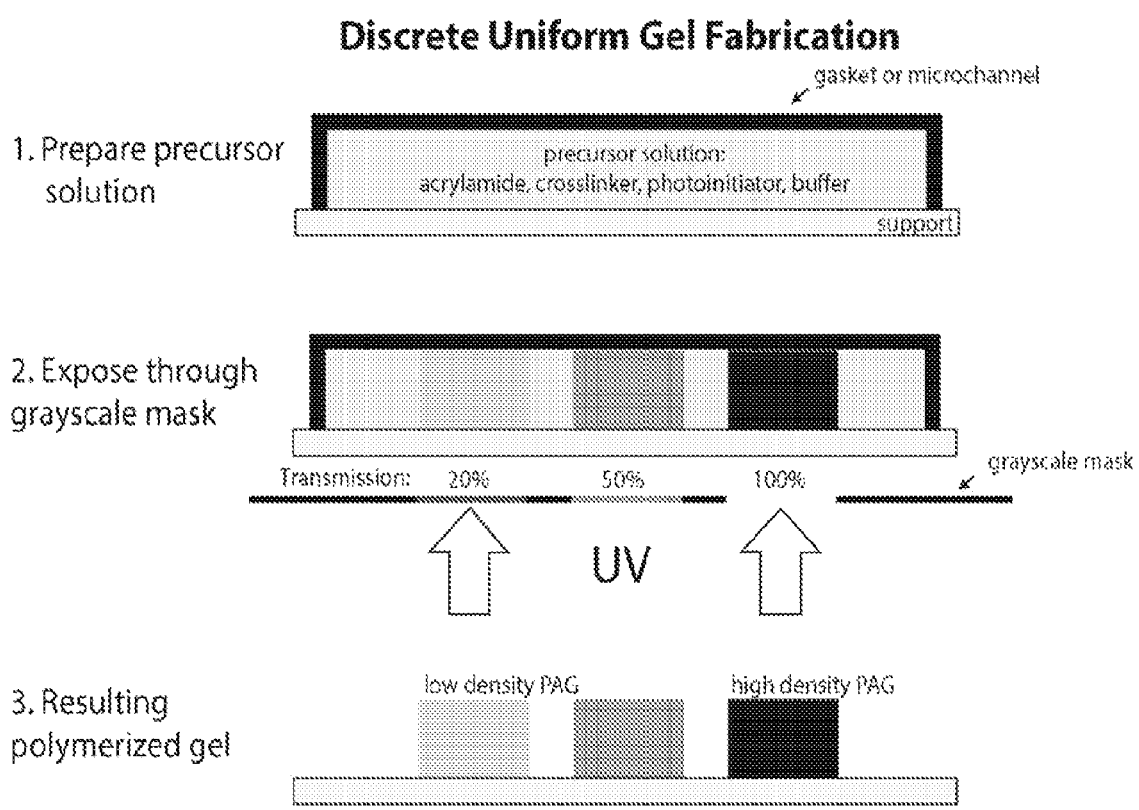
FIG. 4 shows a process flow schematic drawing of a method for producing a spatially varied separation medium according to embodiments of the present disclosure.

FIG. 4 shows a process flow schematic drawing of a method for producing a spatially varied separation medium as described herein. In FIG. 4 (top), a precursor solution is provided in a microchannel or on the surface of a substrate contained in a mold (e.g., a gasket mold). As shown in FIG. 4 (middle), the separation medium precursor solution is exposed to UV light transmitted through a grayscale mask that has regions of different light transmittance. The resulting polymerized separation medium (e.g., polyacrylamine gel; PAG) that is produced includes regions of different densities, depending on the percent transmittance of the grayscale mask in that region (FIG. 4 (bottom)).

Figure 5:
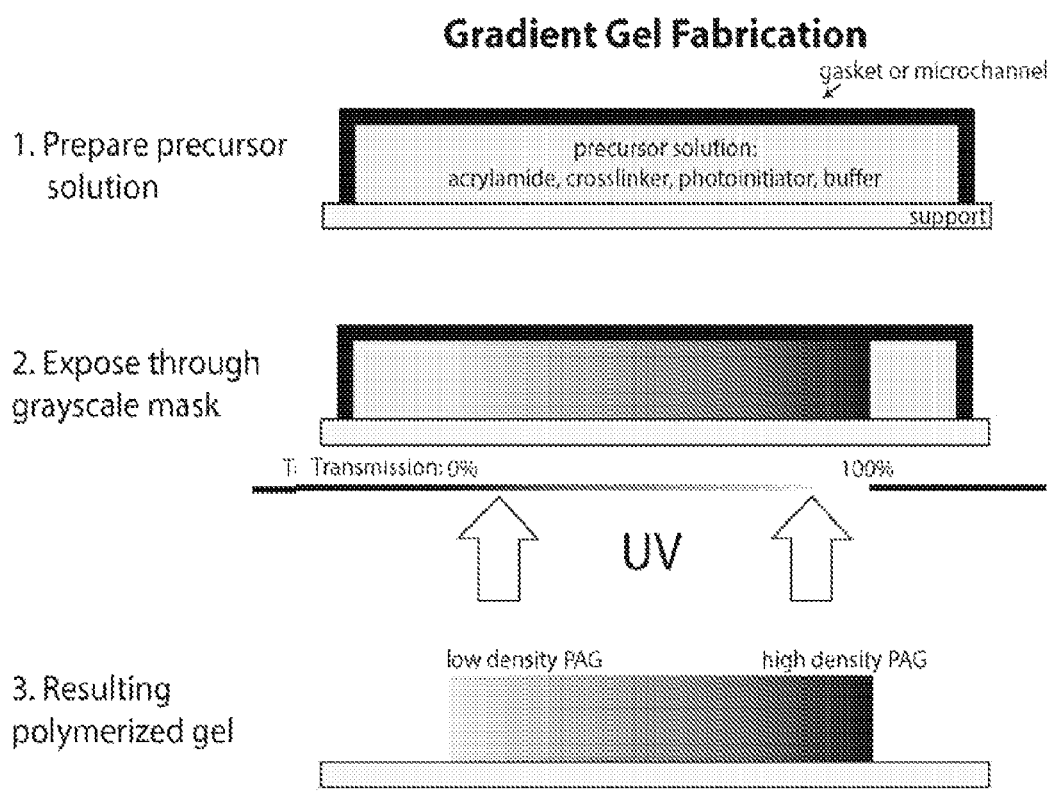
FIG. 5 shows a process flow schematic drawing of a method for producing a gradient separation medium according to embodiments of the present disclosure.

FIG. 5 shows a process flow schematic drawing of a method for producing a gradient separation medium as described herein. In FIG. 5 (top), a precursor solution is provided in a microchannel or on the surface of a substrate contained in a mold (e.g., a gasket mold). As shown in FIG. 5 (middle), the separation medium precursor solution is exposed to UV light transmitted through a gradient mask that has gradient of light transmittance from 0% transmittance to 100% transmittance. The resulting polymerized separation medium (e.g., polyacrylamine gel; PAG) that is produced includes a density gradient that corresponds to the gradient mask (FIG. 5 (bottom)).

In certain embodiments, the spatially varied separation medium produced using the methods described herein is used in methods and systems for detecting an analyte in a sample. As such, the methods of using the spatially varied separation medium include determining whether an analyte is present in a sample, e.g., determining the presence or absence of one or more analytes in a sample. In certain embodiments of the methods, the presence of one or more analytes in the sample may be determined qualitatively or quantitatively. Qualitative determination includes determinations in which a simple yes/no result with respect to the presence of an analyte in the sample is provided to a user. Quantitative determination includes both semi-quantitative determinations in which a rough scale result, e.g., low, medium, high, is provided to a user regarding the amount of analyte in the sample and fine scale results in which an exact measurement of the concentration of the analyte is provided to the user.

In certain embodiments, the microfluidic devices are configured to detect the presence of one or more analytes in a sample. Samples that may be assayed with the subject microfluidic devices may vary, and include both simple and complex samples. Simple samples are samples that include the analyte of interest, and may or may not include one or more molecular entities that are not of interest, where the number of these non-interest molecular entities may be low, e.g., 10 or less, 5 or less, etc. Simple samples may include initial biological or other samples that have been processed in some manner, e.g., to remove potentially interfering molecular entities from the sample. By "complex sample" is meant a sample that may or may not have the analyte(s) of interest (e.g., a sample that is at least suspected of containing the analyte(s) of interest), but also includes different proteins and/or other molecules that are not of interest. In some instances, the complex sample assayed in the subject methods is one that includes 10 or more, such as 20 or more, including 100 or more, e.g., $10^3$ or more, $10^4$ or more (such as 15,000; 20,000 or 25,000 or more) distinct (i.e., different) molecular entities, that differ from each other in terms of molecular structure or physical properties (e.g., molecular weight, size, charge, isoelectric point, etc.).

In certain embodiments, the samples of interest are biological samples, such as, but not limited to, urine, blood, serum, plasma, saliva, semen, prostatic fluid, nipple aspirate fluid, lachrymal fluid, perspiration, feces, cheek swabs, cerebrospinal fluid, cell lysate samples, amniotic fluid, gastrointestinal fluid, biopsy tissue (e.g., samples obtained from laser capture microdissection (LCM)), and the like. The sample can be a biological sample or can be extracted from a biological sample derived from humans, animals, plants, fungi, yeast, bacteria, tissue cultures, viral cultures, or combinations thereof using conventional methods for the successful extraction of DNA, RNA, proteins and peptides. In certain embodiments, the sample is a fluid sample, such as a solution of analytes in a fluid. The fluid may be an aqueous fluid, such as, but not limited to water, a buffer, and the like.

As described above, the samples that may be assayed in the subject methods may include one or more analytes of interest. Examples of detectable analytes include, but are not limited to: nucleic acids, e.g., double or single-stranded DNA, double or single-stranded RNA, DNA-RNA hybrids, DNA aptamers, RNA aptamers, etc.; proteins and peptides, with or without modifications, e.g., antibodies, diabodies, Fab fragments, DNA or RNA binding proteins, phosphorylated proteins (phosphoproteomics), peptide aptamers, epitopes, and the like; small molecules such as inhibitors, activators, ligands, etc.; oligo or polysaccharides; mixtures thereof; and the like.

In some embodiments, the analyte of interest can be identified so that the presence of the analyte of interest can then be detected. Analytes may be identified by any of the methods described herein. For example, an analyte specific binding member that includes a detectable label may be employed. Detectable labels include, but are not limited to, fluorescent labels, colorimetric labels, chemiluminescent labels, enzyme-linked reagents, multicolor reagents, avidin-streptavidin associated detection reagents, non-visible detectable labels (e.g., radiolabels, gold particles, magnetic labels, electrical readouts, density signals, etc.), and the like. In certain embodiments, the detectable label is a fluorescent label. Fluorescent labels are labeling moieties that are detectable by a fluorescence detector. For example, binding of a fluorescent label to an analyte of interest may allow the analyte of interest to be detected by a fluorescence detector. Examples of fluorescent labels include, but are not limited to, fluorescent molecules that fluoresce upon contact with a reagent, fluorescent molecules that fluoresce when irradiated with electromagnetic radiation (e.g., UV, visible light, x-rays, etc.), and the like.

Suitable fluorescent molecules (fluorophores) include, but are not limited to, fluorescein, fluorescein isothiocyanate, succinimidyl esters of carboxyfluorescein, succinimidyl esters of fluorescein, 5-isomer of fluorescein dichlorotriazine, caged carboxyfluorescein-alanine-carboxamide, Oregon Green 488, Oregon Green 514; Lucifer Yellow, acridine Orange, rhodamine, tetramethylrhodamine, Texas Red, propidium iodide, JC-1 (5,5',6,6'-tetrachloro-1,1',3,3'-tetraethylbenzimidazoyl carbocyanine iodide), tetrabromorhodamine 123, rhodamine 6G, TMRM (tetramethyl rhodamine methyl ester), TMRE (tetramethyl rhodamine ethyl ester), tetramethylrosamine, rhodamine B and 4-dimethylaminotetramethylrosamine, green fluorescent protein, blue-shifted green fluorescent protein, cyan-shifted green fluorescent protein, red-shifted green fluorescent protein, yellow-shifted green fluorescent protein, 4-acetamido-4'-isothiocyanatostilbene-2,2'disulfonic acid; acridine and derivatives, such as acridine, acridine isothiocyanate; 5-(2'-aminoethyl)aminonaphthalene-1-sulfonic acid (EDANS); 4-amino-N-[3-vinylsulfonyl)phenyl]naphth-alimide-3,5 disulfonate; N-(4-anilino-1-naphthyl)maleimide; anthranilamide; 4,4-difluoro-5-(2-thienyl)-4-bora-3a,4a diaza-5-indacene-3-propioni-c acid BODIPY; cascade blue; Brilliant Yellow; coumarin and derivatives: coumarin, 7-amino-4-methylcoumarin (AMC, Coumarin 120),7-amino-4-trifluoromethylcoumarin (Coumarin 151); cyanine dyes; cyanosine; 4',6-diaminidino-2-phenylindole (DAPI); 5',5"-dibromopyrogallol-sulfonaphthalein (Bromopyrogallol Red); 7-diethylamino-3-(4'-isothiocyanatophenyl)-4-methylcoumarin; diethylenetriaamine pentaacetate; 4,4'-diisothiocyanatodihydro-stilbene-2-,2'-disulfonic acid; 4,4'-diisothiocyanatostilbene-2,2'-disulfonic acid; 5-(dimethylamino]naphthalene-1-sulfonyl chloride (DNS, dansylchloride); 4-dimethylaminophenylazophenyl-4'-isothiocyanate (DABITC); eosin and derivatives: eosin, eosin isothiocyanate, erythrosin and derivatives: erythrosin B, erythrosin, isothiocyanate; ethidium; fluorescein and derivatives: 5-carboxyfluorescein (FAM),5-(4,6-dichlorotriazin-2-yl)aminofluorescein (DTAF), 2',7'dimethoxy-4'5'-dichloro-6-carboxyfluorescein (JOE), fluorescein, fluorescein isothiocyanate, QFITC, (XRITC); fluorescamine; IR144; IR1446; Malachite Green isothiocyanate; 4-methylumbelliferoneortho cresolphthalein; nitrotyrosine; pararosaniline; Phenol Red; B-phycoerythrin; o-phthaldialdehyde; pyrene and derivatives: pyrene, pyrene butyrate, succinimidyl 1-pyrene; butyrate quantum dots; Reactive Red 4 (Ciba-cron™ Brilliant Red 3B-A) rhodamine and derivatives: 6-carboxy-X-rhodamine (ROX), 6-carboxyrhodamine (R6G), lissamine rhodamine B sulfonyl chloride rhodamine (Rhod), rhodamine B, rhodamine 123, rhodamine X isothiocyanate, sulforhodamine B, sulforhodamine 101, sulfonyl chloride derivative of sulforhodamine 101 (Texas Red); N,N,N',N'-tetramethyl-6-carboxyrhodamine (TAMRA); tetramethyl rhodamine; tetramethyl hodamine isothiocyanate (TRITC); riboflavin; 5-(2'-aminoethyl) aminonaphthalene-1-sulfonic acid (EDANS), 4-(4'-dimethylaminophenylazo)benzoic acid (DABCYL), rosolic acid; $CAL\ Fluor\ Orange\ 560$; terbium chelate derivatives; Cy 3; Cy 5; Cy 5.5; Cy 7; IRD 700; IRD 800; La Jolla Blue; phthalo cyanine; and naphthalo cyanine, coumarins and related dyes, xanthene dyes such as rhodols, resorufins, bimanes, acridines, isoindoles, dansyl dyes, aminophthalic hydrazides such as luminol, and isoluminol derivatives, aminophthalimides, aminonaphthalimides, aminobenzofurans, aminoquinolines, dicyanohydroquinones, fluorescent europium and terbium complexes; combinations thereof, and the like. Suitable fluorescent proteins and chromogenic proteins include, but are not limited to, a green fluorescent protein (GFP), including, but not limited to, a GFP derived from *Aequoria victoria* or a derivative thereof, e.g., a "humanized" derivative such as Enhanced GFP; a GFP from another species such as *Renilla reniformis*, *Renilla mulleri*, or *Ptilosarcus guernyi*; "humanized" recombinant GFP (hrGFP); any of a variety of fluorescent and colored proteins from Anthozoan species; combinations thereof; and the like.

In certain embodiments, the method includes introducing a fluid sample into a microfluidic device. Introducing the fluid sample into the microfluidic device may include directing the sample through a separation medium to produce a separated sample. In some cases, the separated sample is produced by gel electrophoresis as the sample traverses the separation medium, as described above. The separated sample may include distinct detectable bands of analytes, where each band includes one or more analytes that have substantially similar properties, such as molecular weight, size, charge (e.g., charge to mass ratio), isoelectric point, etc. depending on the type of gel electrophoresis performed.

In some embodiments, the methods include the uniplex analysis of an analyte in a sample. By "uniplex analysis" is meant that a sample is analyzed to detect the presence of one analyte in the sample. For example, a sample may include a mixture of an analyte of interest and other molecular entities that are not of interest. In some cases, the methods include the uniplex analysis of the sample to determine the presence of the analyte of interest in the sample mixture.

Certain embodiments include the multiplex analysis of two or more analytes in a sample. By "multiplex analysis" is meant that the presence two or more distinct analytes, in which the two or more analytes are different from each other, is determined. For example, analytes may include detectable differences in their molecular weight, size, charge (e.g., mass to charge ratio), isoelectric point, and the like. In some instances, the number of analytes is greater than 2, such as 4 or more, 6 or more, 8 or more, etc., up to 20 or more, e.g., 50 or more, including 100 or more, distinct analytes. In certain embodiments, the methods include the multiplex analysis of 2 to 100 distinct analytes, such as 4 to 50 distinct analytes, including 4 to 20 distinct analytes.

In certain embodiments, the method of detecting an analyte in a sample is an automated method. As such, the method may include a minimum of user interaction with the microfluidic devices and systems after introducing the sample into the microfluidic device. For example, the step of directing the sample through the separation medium to produce a separated sample may be performed by the microfluidic device and system, such that the user need not manually perform these steps. In some cases, the automated method may facilitate a reduction in the total assay time. For example, embodiments of the method, including the separation and detection of analytes in a sample, may be performed in 30 min or less, such as 20 min or less, including 15 min or less, or 10 min or less, or 5 min or less, or 2 min or less, or 1 min or less.

Microfluidic Devices

Devices of the present disclosure include a separation medium produced by the methods described herein. In some instances, the device is a microfluidic device that includes one or more microchannels and/or microchambers. In certain embodiments, the microchannel includes a separation medium. The separation medium can include one or more regions that have different densities (e.g., porosities), as described herein. For instance, the separation medium may include a pore size gradient along a length of the microchannel, such that the pore size changes, e.g., increases or decreases, from one portion of the microchannel to another. In some instances, the gradient is linear, such that the pore size changes in a linear fashion along the length of the microchannel.

The length of a given microchannel (i.e., the length of a given microchannel that is occupied by a separation medium having a pore size gradient) may vary. In some instances, the microchannel is an elongated microchannel, such that the length of the microchannel is longer that the width of the microchannel. For example, the length to width ratio of the microchannel may be 5:1 or more, or 10:1 or more, or 20:1 or more, or 50:1 or more, or 75:1 or more, or 100:1 or more, or 250:1 or more, or 500:1 or more, or 750:1 or more, or 1000:1 or more. In some instances, the length of the microchannel is 2 mm or longer, such as 5 mm or longer, e.g., 7.5 mm or longer or 10 mm or longer. In certain embodiments, the length of a given microchannel may range from 2 to 15 mm, such as 3 to 10 mm, including 5 to 7 mm. In certain embodiments, the microfluidic channels have a width ranging from 1 μm to 500 μm, such as from 5 μm to 300 μm, including from 10 μm to 200 μm, for example from 50 μm to 150 μm. In some instances, the microfluidic channels have a width of 100 μm. In certain embodiments, the microfluidic channels have a depth ranging from 1 μm to 200 μm, such as from 5 μm to 100 μm, including from 10 μm to 50 μm. In some cases, the microfluidic channels have a depth of 25 μm.

In certain embodiments, the separation medium includes two or more regions having different densities (e.g., different porosities). For example, the separation medium may include a first region having a first density (e.g., porosity), and a second region having a second density (e.g., porosity) different from the first region. In certain embodiments, the separation medium includes a region that has different densities (e.g., porosities) within the same region. For instance, the separation medium may include a region where the density (e.g., porosity) varies within the same region, such as a region where the density (e.g., porosity) varies gradually across the region. For example, the separation medium may include a region of low density and a region of high density with an increasing density from the region of low density to the region of high density. In some instances, the density gradient is a linear gradient, such that the density of the gradient increases linearly from the region of low density to the region of high density.

Figure 9A:
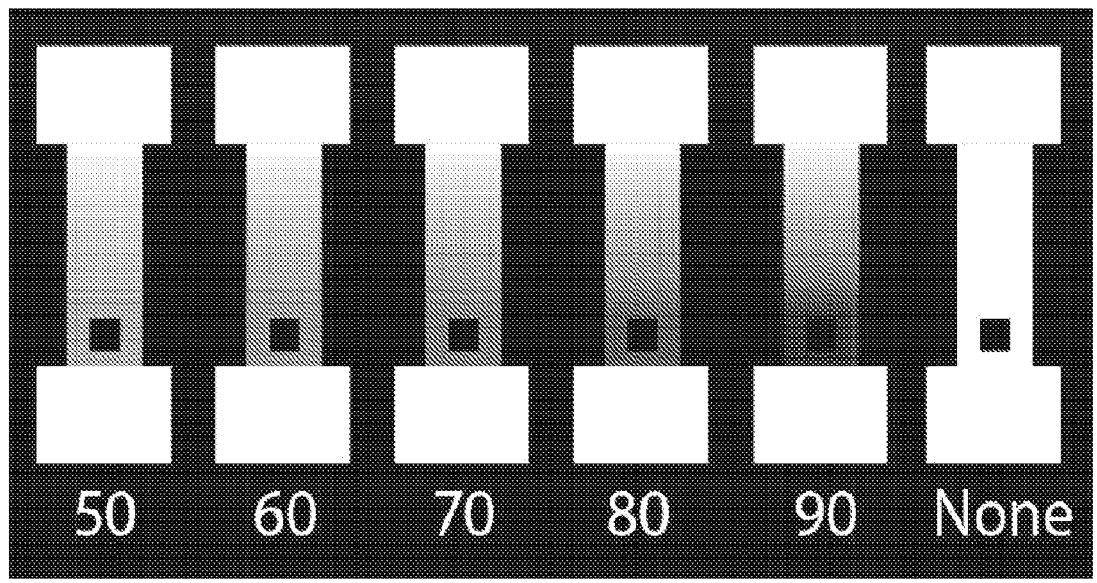
FIG. 9A shows a schematic of various separation media that have different density gradients; e.g., 50% gradient, 60% gradient, 70% gradient, 80% gradient, 90% gradient, and no gradient).
Figure 9B:
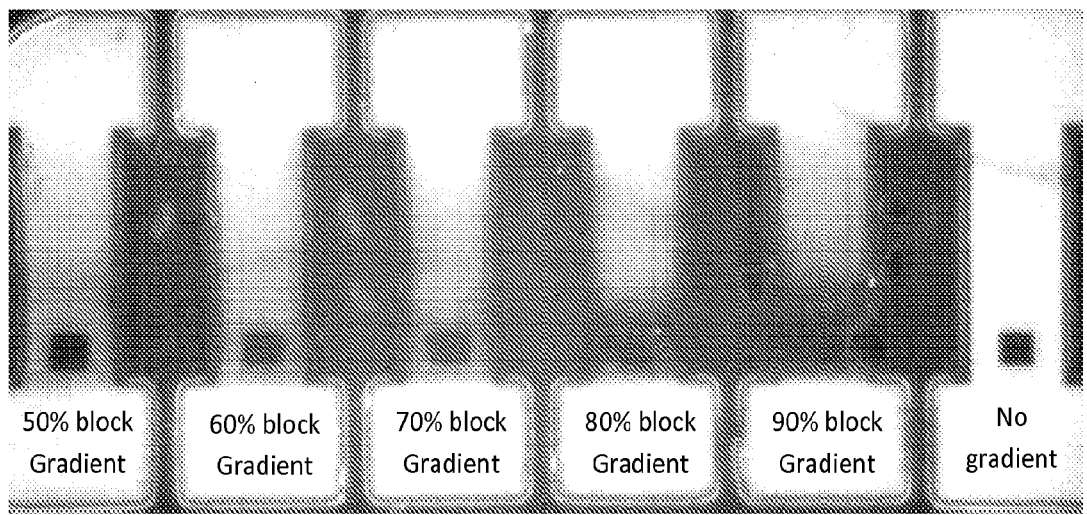
FIG. 9B shows the corresponding fluorescence image of various separation media gradients produced according to the methods disclosed herein.
Figure 9C:
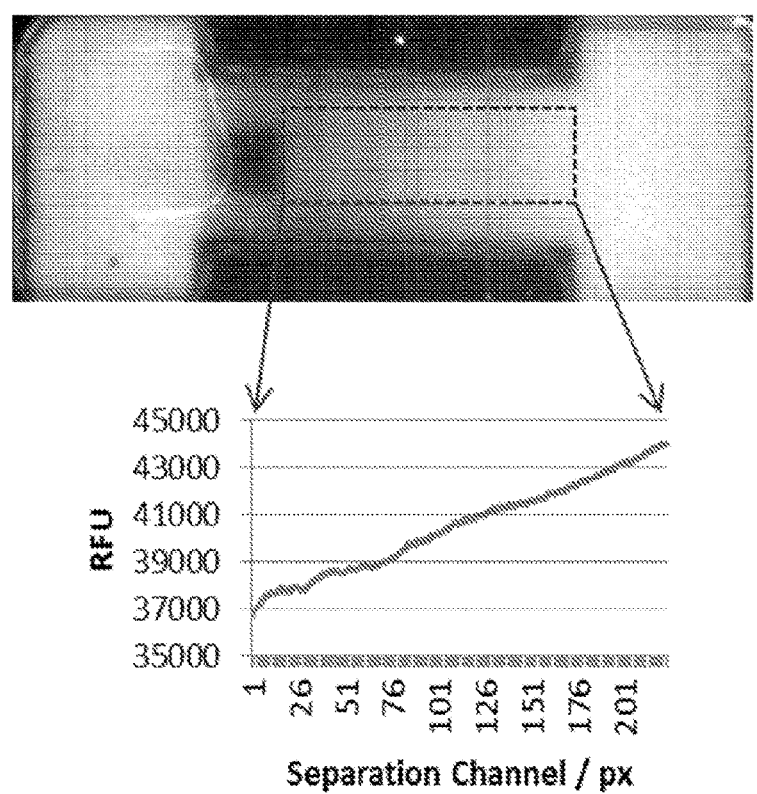
FIG. 9C shows a fluorescence image (top) and corresponding graph (bottom) of relative fluorescence units (RFU) vs. position in the separation channel (pixel) for a gradient separation medium produced using the methods disclosed herein.

FIG. 9A shows a schematic of various separation media that have different density gradients; e.g., 50% gradient, 60% gradient, 70% gradient, 80% gradient, 90% gradient, and no gradient). FIG. 9B shows the corresponding fluorescence image of various separation media gradients produced according to the methods disclosed herein. The separation media in FIG. 9B included fluorescent monomers that were visualized using a fluorescence detector to indicate the amount of polyacrylamide incorporated into the separation gels. FIG. 9C shows a fluorescence image (top) and corresponding graph (bottom) of relative fluorescence units (RFU) vs. position in the separation channel (pixel) for a gradient separation medium produced using the methods disclosed herein.

Figure 10C:
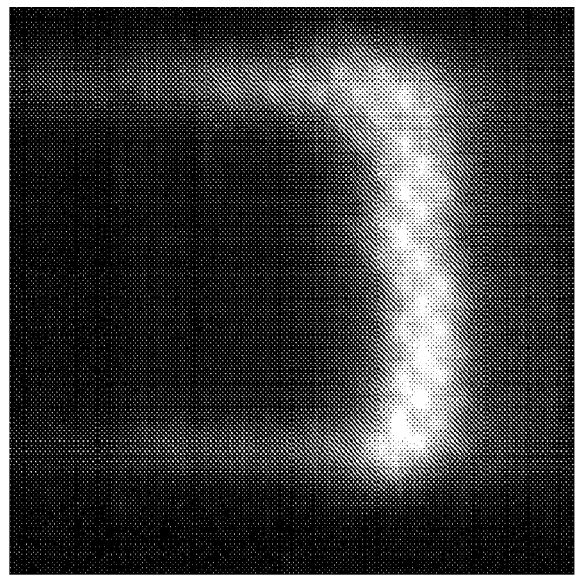
FIG. 10C shows an enlarged view of a band of fluorescent protein, which shows pixilation of the separation medium from a laser printed grayscale photomask.

FIG. 10A shows a series of fluorescent images over time of a gradient separation media produced according to the methods disclosed herein. A sample fluorescent protein was run through the gradient gel and monitored over time. FIG. 10B shows a graph (FIG. 10B, top) of the corresponding location (mm) vs. time (s), and (FIG. 10B, bottom) of velocity (μm/s) vs. time (s) for the sample fluorescent protein. FIG. 10C shows an enlarged view of a band of fluorescent protein, which shows pixilation of the separation medium from a laser printed grayscale photomask.

Any convenient separation medium may be employed in the microfluidic device. In certain embodiments, the microfluidic device includes a polymer, such as a polymeric gel. The polymeric gel may be a gel suitable for gel electrophoresis. The polymeric gel may include, but is not limited to, a polyacrylamide gel (e.g., methacrylamide gel), an agarose gel, and the like. Accordingly, the gel may include suitable polymers, such as acrylate polymers, alkylacrylate polymers, alkyl alkylacrylate polymers, copolymers thereof, and the like. Any convenient cross-linker may be employed, where cross-linkers of interest include, but are not limited to: bis-acrylamide, and the like.

The resolution of the separation medium may depend on various factors, such as, but not limited to, pore size, total polymer content (e.g., total acrylamide content), concentration of cross-linker, applied electric field, assay time, and the like. For instance, the resolution of the separation medium may depend on the pore size of the separation medium. In some cases, the pore size depends on the total polymer content of the separation medium and/or the concentration of cross-linker in the separation medium. In certain instances, the separation medium is configured to resolve analytes with molecular mass differences of 50,000 Da or less, or 25,000 Da or less, or 10,000 Da or less, such as 7,000 Da or less, including 5,000 Da or less, or 2,000 Da or less, or 1,000 Da or less, for example 500 Da or less, or 100 Da or less. In some cases, the separation medium may include a polyacrylamide gel that has a total acrylamide content, T (T=total concentration of acrylamide and bisacrylamide monomer), ranging from 1% to 20%, such as from 3% to 15%, including from 5% to 10%.

In some instances, the porosity of the separation medium may be described in terms of the concentration of a monomer (% T) that is present in the microchannel prior to polymerization. In some instances, the concentration of monomer in the microchannel prior to polymerization may range from 1% T to 50% T, such as 2% to 40% T, including 5% to 25% T.

In certain embodiments, the separation medium is configured to be formed from precursor moieties. For example, the separation medium may be a gel (e.g., a polyacrylamide gel) formed form gel precursors (e.g., polyacrylamide gel precursors, such as polyacrylamide gel monomers). The precursor moieties may be configured to react to form the separation medium. For instance, the gel precursors may be configured to react with each other to form the polyacrylamide gel separation medium. The reaction between the gel precursors may be activated by any suitable protocol, such as, but not limited to, chemical activation, light activation, etc. In some embodiments, the gel precursors are configured to be activated chemically, for example by contacting the gel precursors with an activation agent, such as, but not limited to, a peroxide. In some embodiments, the gel precursors are configured to be activated by light (i.e., photo-activated), for instance by contacting the gel precursors with light. The light may be of any wavelength suitable for activating the formation of the separation medium, and in some instances may have a wavelength associated with blue light in the visible spectrum. For example, the light used to activate formation of the separation medium may have a wavelength ranging from 400 nm to 500 nm, such as from 410 nm to 490 nm, including from 420 nm to 480 nm, or from 430 nm to 480 nm, or from 440 nm to 480 nm, or from 450 nm to 480 nm, or from 460 nm to 480 nm, or from 465 nm to 475 nm. In certain cases, the light used to activate formation of the separation medium has a wavelength ranging from 465 to 475 nm. In some instances, the light used to activate formation of the separation medium has a wavelength of 470 nm.

Figure 8A:
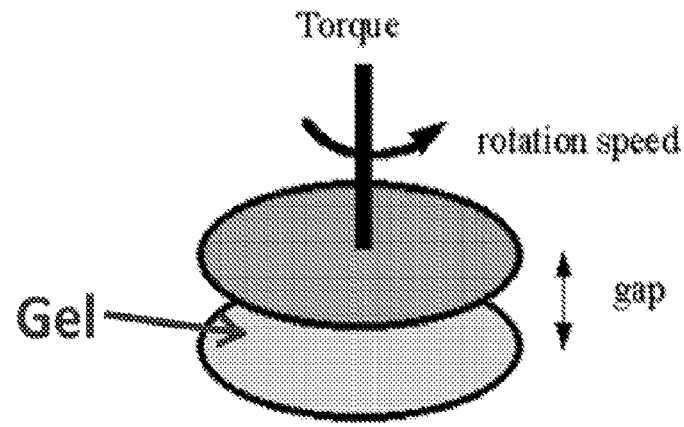
FIG. 8A shows a schematic of a stress rheometer used to measure the stiffness of a separation medium produced according to the methods described herein.
Figure 8B:
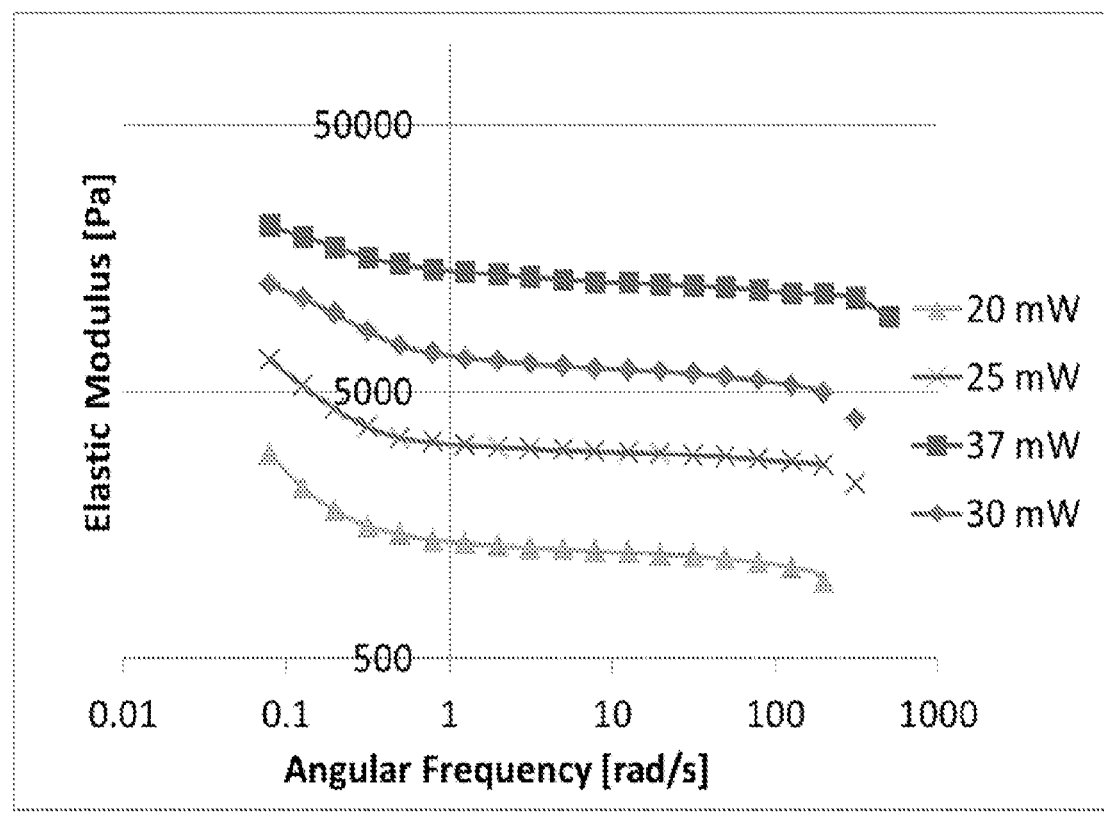
FIG. 8B shows a graph of elastic modulus (Pa) vs. angular frequency (rad/s) for the rheometer stiffness tests for the separation media produced at different UV light intensities.
Figure 8C:
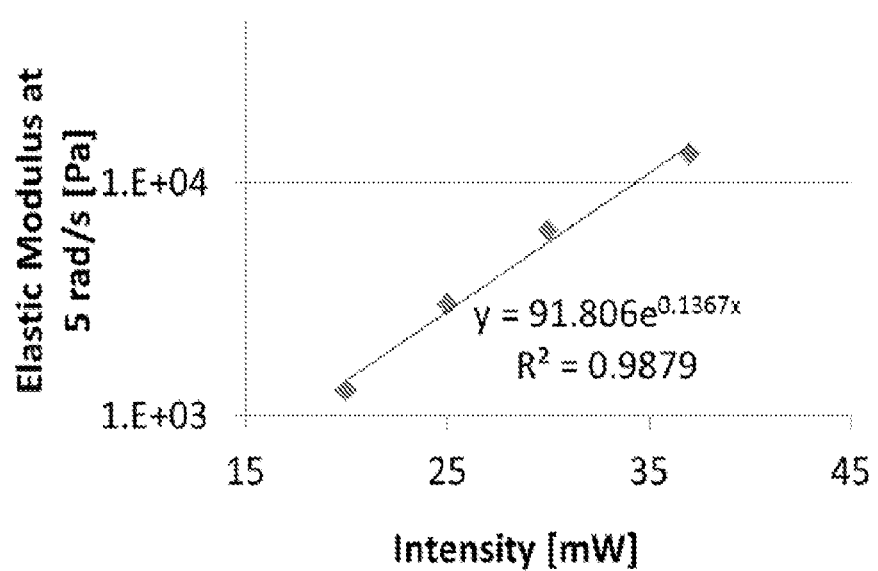
FIG. 8C shows a graph of elastic modulus at 5 rad/s (Pa) vs. UV light intensity (mW).

The porosity of the separation medium may depend on various factors, such as the concentration of the monomer precursor, the concentration of the crosslinker, the concentration of the initiator, the intensity of the light contacting the precursor solution, and the like. In certain embodiments, the porosity (e.g., density) of the separation medium depends on the intensity of the light that contacts the separation medium precursor solution. The porosity (e.g., density) of the separation medium can be measured by determining the stiffness of the resulting separation medium suing a stress rheometer, for example as shown in FIG. 8A. Various separation gels were produced at different UV light intensities (e.g., 37, 30, 25, 20 mW/cm$^2$) without a grayscale mask to test whether exposure of the separation medium precursor solution to different light intensities would produce gels of different stiffness. FIG. 8B shows a graph of elastic modulus (Pa) vs. angular frequency (rad/s) for the rheometer stiffness tests for the separation media produced at different UV light intensities. As shown in FIG. 8B, the elastic modulus was greater at higher UV light intensities. FIG. 8C shows a graph of elastic modulus at 5 rad/s (Pa) vs. UV light intensity (mW). As shown in FIG. 8C, the elastic modulus at 5 rad/s increased linearly with increased UV light intensity. FIGS. 8A-8C demonstrate that a spatially varied separation medium can be produced by exposing different regions of precursor solutions to different light intensities.

In certain embodiments, the separation medium precursor solution, and thus the resulting separation medium, has a homogeneous composition. For example, the concentration of the monomer in the separation medium precursor solution may be substantially the same throughout the separation medium precursor solution (such that the monomer concentration (% T) does not substantially increase or decrease across the separation medium precursor solution. In certain instances, the porosity of a separation medium produced from a substantially homogeneous precursor solution depends on the intensity of light that contacts the precursor solution to initiate formation of the separation medium. As described herein, the intensity of the light that contacts the precursor solution may be modulated using a grayscale mask as described herein.

In certain embodiments, the precursor solution may also include a crosslinker. The crosslinker concentration (% C) may also be homogeneous throughout the precursor solution, such that the crosslinker concentration is substantially constant across the separation medium precursor solution, and may, for example, range from 1 to 15%, such as 2 to 10%. In certain instances, the porosity of a separation medium produced from a substantially homogeneous precursor solution depends on the intensity of light that contacts the precursor solution to initiate formation of the separation medium. As described herein, the intensity of the light that contacts the precursor solution may be modulated using a grayscale mask as described herein.

In certain embodiments, the separation medium precursor solution includes a polymerization initiator. The polymerization initiator may be configured to facilitate the polymerization of the separation medium precursor monomers into the separation medium. In some cases, the polymerization initiator is a chemically activated initiator that initiates polymerization of the precursor monomers upon exposure to an activator. In some cases, the polymerization initiator is a photo-activated initiator (e.g., a photoinitiator) that initiates polymerization of the precursor monomers upon exposure to light. In certain embodiments, the polymerization initiator is selected from one or more of riboflavin, ammonium persulfate (APS), tetramethylethylenediamine (TEMED), combinations thereof, and the like.

Embodiments of the present disclosure include a free-standing separation medium associated with a support. By "free-standing" is meant that the separation medium is associated with a support, such as disposed on the surface of a substrate. For instance, the separation medium may be disposed on the surface of a support such that only the bottom surface of the separation medium is in contact with the surface of the support. In these instances, the sides of the separation medium (e.g., the sides of the separation medium extending up from the bottom of the separation medium) may not be in contact with a support, or a surrounding chamber or channel (e.g., a microfluidic chamber or microchannel) if present. Similarly, the top surface of the separation medium may not be in contact with a support, or the surrounding chamber or channel (e.g., a microfluidic chamber or microchannel) if present. In some instances, the free-standing separation medium may be disposed on the surface of a support and surrounded by the ambient environment. In other cases, the free-standing separation medium may be disposed on the surface of a support and positioned inside an environmental chamber, such that the free-standing separation medium is surrounded by the environment provided inside the environmental chamber. For instance, the environmental chamber may contain an environment (e.g., an assay environment) that has a higher humidity than ambient conditions. An assay environment with a higher humidity may facilitate a reduction in evaporation of liquids (e.g., buffers, etc.) from the separation medium.

The separation medium may be configured to separate the analytes in a sample from each other. In some cases, the separation medium is configured to separate the analytes in a sample based on the physical properties of the analytes. For example, the separation medium may be configured to separate the analytes in the sample based on the molecular weight, size, charge (e.g., charge to mass ratio), isoelectric point, etc. of the analytes. In certain instances, the separation medium is configured to separate the analytes in the sample based on the molecular weight of the analytes. In some cases, the separation medium is configured to separate the analytes in the sample based on the isoelectric point of the analytes (e.g., isoelectric point focusing). The separation medium may be configured to separate the analytes in the sample into distinct detectable bands of analytes. By "band"

is meant a distinct detectable region where the concentration of an analyte is significantly higher than the surrounding regions. Each band of analyte may include a single analyte or several analytes, where each analyte in a single band of analytes has substantially similar physical properties, as described above.

In certain embodiments, the separation medium is configured to separate the analytes in a sample as the sample traverses the separation medium. In some cases, the separation medium is configured to separate the analytes in the sample as the sample flows through the separation medium. In certain embodiments, the separation medium includes a polymer, such as a polymeric gel. The polymeric gel may be a gel suitable for gel electrophoresis. The polymeric gel may include, but is not limited to, a polyacrylamide gel, an agarose gel, and the like. The resolution of the separation medium may depend on various factors, such as, but not limited to, pore size, total polymer content (e.g., total acrylamide content), concentration of cross-linker, applied electric field, assay time, and the like. For instance, the resolution of the separation medium may depend on the pore size of the separation medium. In some cases, the pore size depends on the total polymer content of the separation medium and/or the concentration of cross-linker in the separation medium. In certain instances, the separation medium is configured to resolve analytes with molecular weight differences of 10,000 Da or less, such as 7,000 Da or less, including 5,000 Da or less, or 2,000 Da or less, or 1,000 Da or less, for example 500 Da or less, or 100 Da or less. In some cases, the separation medium may include a polyacrylamide gel that has a total acrylamide content of ranging from 1% to 50%, such as from 1% to 40%, including from 1% to 30%. While the length of the separation medium may vary, in some instances the length is short, e.g., 0.5 to 20 mm, such as 0.5 to 10 mm, e.g., 0.5 to 5 mm, e.g. 5 mm.

In certain embodiments, the microfluidic device includes one or more electric field generators configured to generate an electric field. The electric field generator may be configured to apply an electric field to the separation medium. The electric field generators may be configured to electrokinetically transport the analytes and moieties in a sample through the various media in the microfluidic device. In certain instances, the electric field generators may be proximal to the microfluidic device, such as arranged on the microfluidic device. In some cases, the electric field generators are positioned a distance from the microfluidic device. For example, the electric field generators may be incorporated into a system for detecting an analyte, as described in more detail below. In some instances, the electric field has a voltage of 500 V or less, such as 400 V or less, or 300 V or less, or 200 V or less, or 100 V or less, such as 50V or less, including 25 V or less, e.g., 15 V or less, such as 10 V or less.

In certain embodiments, the separation medium includes a buffer. The buffer may be any convenient buffer used for gel electrophoresis. In certain embodiments, the buffer is a Tris buffer. In certain embodiments, the separation medium includes a buffer, such as a Tris-glycine buffer. For example, the buffer may include a mixture of Tris and glycine.

In some cases, the buffer includes a detergent. In certain instances, the detergent is configured to provide analytes in the sample with substantially similar charge-to-mass ratios. Analytes with substantially similar charge-to-mass ratios may facilitate the separation of the analytes into one or more bands in the separation medium based on the molecular masses of the analytes in the sample. In certain cases, the detergent is anionic detergent configured to provide analytes in the sample with a charge, such as a negative charge. For example, the detergent may be an anionic detergent, such as, but not limited to, sodium dodecyl sulfate (SDS).

Aspects of the microfluidic devices include embodiments where the microfluidic device is configured to subject a sample to a flow field. By "flow field" is meant a region where components traverse the region in substantially the same direction. For example, a flow field may include a region where mobile components move through a medium in substantially the same direction. A flow field may include a medium, such as a separation medium, a loading medium, etc., where components, such as buffers, analytes, reagents, etc., move through the medium in substantially the same direction. A flow field may be induced by an applied electric field, a pressure differential, electroosmosis, and the like. In some embodiments, flow field may be directionally distinct. For example, the flow field may be aligned with the directional axis of the separation medium. The flow field may be configured to direct the sample or constituents (e.g., analytes) through the elongated flow path containing the separation medium.

Embodiments of the support may be made of any suitable material that is compatible with the microfluidic devices and compatible with the samples, buffers, reagents, etc. used in the microfluidic devices. In some cases, the support is made of a material that is inert (e.g., does not degrade or react) with respect to the samples, buffers, reagents, etc. used in the subject microfluidic devices and methods. For instance, the support may be made of materials, such as, but not limited to, glass, quartz, polymers, elastomers, paper, combinations thereof, and the like.

In some instances, the microfluidic devices include a sample loading element associated with the separation medium. The sample loading element may be configured to allow a sample to be introduced into the microfluidic device. The sample loading element may be in fluid communication with the separation medium. In some instances, the sample loading element is in fluid communication with the upstream end of the separation medium. The sample loading element may further include a structure configured to prevent fluid from exiting the sample loading element. For example, the sample loading element may include one or more walls configured to substantially prevent fluid, including the sample and/or buffer, from exiting the sample loading element. In some cases, the sample loading element may be configured as a well in the separation medium.

In some cases, the microfluidic device may include an elongated flow path that includes the separation medium. The elongated flow path may have a width of 1 mm or less, such as 500 µm or less, including 250 µm or less, or 200 µm or less, or 150 µm or less, or 100 µm or less, or 75 µm or less, or 50 µm or less, or 40 µm or less, or 30 µm or less, or 20 µm or less, or 10 µm or less. In some instances, the elongated flow path that includes the separation medium has a width of 70 µm. In some cases, the elongated flow path that includes the separation medium has a length ranging from 0.5 mm to 50 mm, such as from 0.5 mm to 25 mm, including from 1 mm to 20 mm, or from 5 mm to 15 mm. In certain embodiments, the elongated flow path that includes the separation medium has a length of 10 mm. In certain instances, the elongated flow path that includes the separation medium has a depth of 100 µm or less, such as 75 µm or less, including 50 µm or less, or 25 µm or less, or 20 µm or less, or 15 µm or less, or 10 µm or less, or 5 µm or less. In some instances, the elongated flow path that includes the separation medium has a depth of 10 µm. The dimensions of the separation medium itself may be similar to the widths, lengths and depths listed above.

Aspects of the microfluidic device also include embodiments that have two or more elongated flow paths, each of which includes a separation medium as described above. The two or more elongated flow paths may be arranged on the microfluidic device in parallel or in series. For instance, the two or more elongated flow paths may be arranged in parallel, which, in some embodiments, may facilitate the analysis of two or more samples simultaneously. Microfluidic devices may include 2 or more, such as 4 or more, including 8 or more, 12 or more, 16 or more, 20 or more, 24 or more, 36 or more, 54 or more, or 100 or more elongated flow paths arranged in parallel. In some cases, the two or more elongated flow paths may be arranged in series. For example, the microfluidic device may include a first elongated flow path and a second elongated flow path arranged in series. Microfluidic devices may include 2 or more, such as 4 or more, including 8 or more, 12 or more, 16 or more, 20 or more, 24 or more, 36 or more, 54 or more, or 100 or more elongated flow paths arranged in series. In some embodiments, the microfluidic devices include a plurality of elongated flow paths arranged both in series and in parallel. In some instances, arrangement of elongated flow paths in parallel and in series provides an array of elongated flow paths, and as such, provides an array of separation media, arranged in series and in parallel in the microfluidic device.

In certain embodiments, the microfluidic device has a width ranging from 10 cm to 1 mm, such as from 5 cm to 5 mm, including from 1 cm to 5 mm. In some instances, the microfluidic has a length ranging from 100 cm to 1 mm, such as from 50 cm to 1 mm, including from 10 cm to 5 mm, or from 1 cm to 5 mm. In certain aspects, the microfluidic device has an area of 1000 $cm^2$ or less, such as 100 $cm^2$ or less, including 50 $cm^2$ or less, for example, 10 $cm^2$ or less, or 5 $cm^2$ or less, or 3 $cm^2$ or less, or 1 $cm^2$ or less, or 0.5 $cm^2$ or less, or 0.25 $cm^2$ or less, or 0.1 $cm^2$ or less.

In certain embodiments, the microfluidic device is substantially transparent. By "transparent" is meant that a substance allows visible light to pass through the substance. In some embodiments, a transparent microfluidic device facilitates detection of analytes in the separation medium, for example analytes that include a detectable label, such as a fluorescent label. In some cases, the microfluidic device is substantially opaque. By "opaque" is meant that a substance does not allow visible light to pass through the substance. In certain instances, an opaque microfluidic device may facilitate the analysis of analytes that are sensitive to light, such as analytes that react or degrade in the presence of light.

Further aspects related to microfluidic devices, separation media for microfluidic devices, and methods for using microfluidic devices are found in U.S. Application Publication No. 2012/0329040, the disclosure of which is incorporated herein by reference in its entirety.

Systems

Aspects of the present disclosure include a system for producing a separation medium described herein. In certain instances, the system includes: a support configured to contain a separation medium precursor solution; a photomask that includes a semi-transparent region; and a light source configured to direct a light from the light source to the separation medium precursor solution through the photomask.

In certain embodiments, the photomask includes two or more regions having a different light transmittance as described herein. In certain instances, the system includes a light diffuser between the support and the photomask. In other embodiments, the system does not include a light diffuser between the support and the photomask. As described above, in some cases, the photomask is configured to minimize pixilation of light transmitted through the grayscale mask such that a light diffuser is not needed between the photomask and support (e.g., the gel precursor solution on the support).

In certain embodiments, the support includes a gasket on a surface of the support configured to contain the separation medium precursor solution. The gasket may be configured as a mold that determines the shape of the resulting gel. In some cases, the mold includes one or more features, such as pillars configured to produce voids in the resulting gel, e.g., sample loading wells in the resulting gel. In certain instances, the support includes a microchannel configured to contain the separation medium precursor solution.

Aspects of certain embodiments include a system for detecting an analyte in a sample. In some instances, the system includes a microfluidic device as described herein. The system may also include a detector. In some cases, the detector is a detector configured to detect a detectable label. As described above, the detectable label may be a fluorescent label. For example, the fluorescent label can be contacted with electromagnetic radiation (e.g., visible, UV, x-ray, etc.), which excites the fluorescent label and causes the fluorescent label to emit detectable electromagnetic radiation (e.g., visible light, etc.). The emitted electromagnetic radiation may be detected with an appropriate detector to determine the presence of the analyte in a sample separated by the separation medium.

In some instances, the detector may be configured to detect emissions from a fluorescent label, as described above. In certain cases, the detector includes a photomultiplier tube (PMT), a charge-coupled device (CCD), an intensified charge-coupled device (ICCD), a complementary metal-oxide-semiconductor (CMOS) sensor, a visual colorimetric readout, a photodiode, and the like.

Systems of the present disclosure may include various other components as desired. For example, the systems may include fluid handling components, such as microfluidic fluid handling components. The fluid handling components may be configured to direct one or more fluids to and/or from the microfluidic device. In some instances, the fluid handling components are configured to direct fluids, such as, but not limited to, sample solutions, buffers (e.g., release buffers, wash buffers, electrophoresis buffers, etc.), and the like. In certain embodiments, the microfluidic fluid handling components are configured to deliver a fluid to the separation medium (or sample loading element) of the microfluidic device, such that the fluid contacts the separation medium (or sample loading element). The fluid handling components may include microfluidic pumps. In some cases, the microfluidic pumps are configured for pressure-driven microfluidic handling and routing of fluids to and/or from the microfluidic devices and systems disclosed herein. In certain instances, the microfluidic fluid handling components are configured to deliver small volumes of fluid, such as 1 mL or less, such as 500 μL or less, including 100 μL or less, for example 50 μL or less, or 25 μL or less, or 10 μL or less, or 5 μL or less, or 1 μL or less.

In certain embodiments, the systems include one or more electric field generators. An electric field generator may be configured to apply an electric field to various regions of the microfluidic device. The system may be configured to apply an electric field such that the sample is electrokinetically transported through the microfluidic device. For example, the electric field generator may be configured to apply an electric field to the separation medium. In some cases, the applied electric field may be aligned with the directional axis of the separation flow path of the separation medium. As such, the applied electric field may be configured to electrokinetically transport the analytes and moieties in a sample through the separation medium. In some cases, the applied electric field is configured to electrokinetically transport selected analytes that have been separated by the separation medium. Selected analytes that have been separated by the separation medium may be transported to a second medium (e.g., a blotting medium) or a collection reservoir for subsequent analysis by applying an appropriate electric field to the separation medium along a desired directional axis. In some cases, the directional axis is orthogonal to the directional axis of the separation medium used during separation of the analytes in the sample. In some instances, the electric field generators are configured to apply an electric field with a strength ranging from 10 V/cm to 1000 V/cm, such as from 100 V/cm to 800 V/cm, including from 200 V/cm to 600 V/cm.

In certain embodiments, the electric field generators include voltage shaping components. In some cases, the voltage shaping components are configured to control the strength of the applied electric field, such that the applied electric field strength is substantially uniform across the separation medium. The voltage shaping components may facilitate an increase in the resolution of the analytes in the sample. For instance, the voltage shaping components may facilitate a reduction in non-uniform movement of the sample through the separation medium. In addition, the voltage shaping components may facilitate a minimization in the dispersion of the bands of analytes as the analytes traverses the separation medium.

In certain embodiments, the subject system is a biochip (e.g., a biosensor chip). By "biochip" or "biosensor chip" is meant a microfluidic system that includes a substrate surface which displays two or more distinct microfluidic devices on the substrate surface. In certain embodiments, the microfluidic system includes a substrate surface with an array of microfluidic devices.

An "array" includes any two-dimensional or substantially two-dimensional (as well as a three-dimensional) arrangement of addressable regions, e.g., spatially addressable regions. An array is "addressable" when it has multiple devices positioned at particular predetermined locations (e.g., "addresses") on the array. Array features (e.g., devices) may be separated by intervening spaces. Any given substrate may carry one, two, four or more arrays disposed on a front surface of the substrate. Depending upon the use, any or all of the arrays may be the same or different from one another and each may contain multiple distinct microfluidic devices and/or separation media. An array may contain one or more, including two or more, four or more, 8 or more, 10 or more, 50 or more, or 100 or more microfluidic devices and/or separation media. In certain embodiments, the microfluidic devices and/or separation media can be arranged into an array with an area of less than 10 cm$^2$, or less than 5 cm$^2$, e.g., less than 1 cm$^2$, including less than 50 mm$^2$, less than 20 mm$^2$, such as less than 10 mm$^2$, or even smaller. For example, microfluidic devices and/or separation media may have dimensions in the range of 10 mm×10 mm to 200 mm×200 mm, including dimensions of 100 mm×100 mm or less, such as 50 mm×50 mm or less, for instance 25 mm×25 mm or less, or 10 mm×10 mm or less, or 5 mm×5 mm or less, for instance, 1 mm×1 mm or less.

Figure 12:
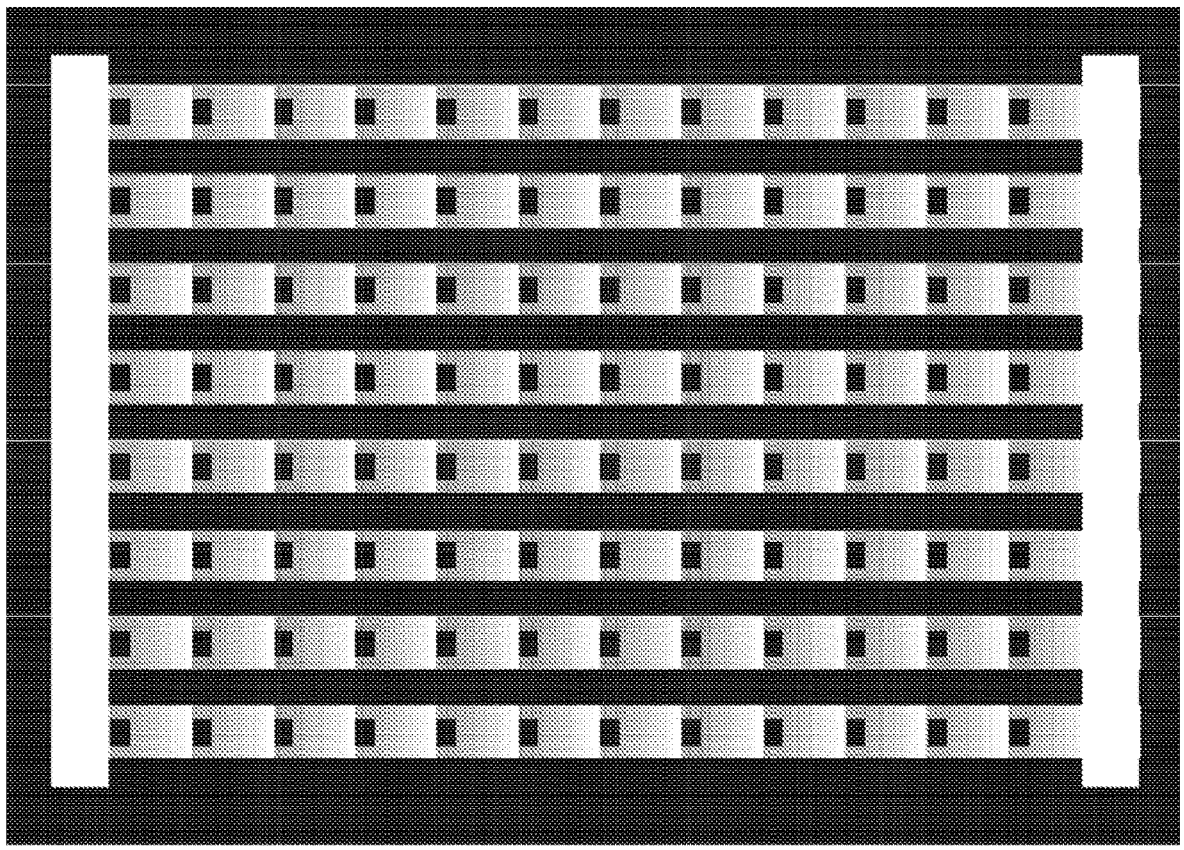
FIG. 12 shows a schematic drawing of a 96-plex gradient gel-based separation device that includes an array of 8 parallel lanes of 12 gradient separation media arranged in series.

Arrays of microfluidic devices and/or separation media may be arranged for the multiplex analysis of samples. For example, multiple microfluidic devices and/or separation media may be arranged in series, such that multiple different samples may be analyzed at the same time in different microfluidic devices and/or separation media arrange in series. In certain embodiments, multiple microfluidic devices may be arranged in parallel, such that two or more samples may be analyzed at substantially the same time in different microfluidic devices and/or separation media arranged in parallel. In certain embodiments, the microfluidic devices may be arranged in series and in parallel in the same device to provide an array of separation media. In certain embodiments, the separation media that are arranged in series are formed from a contiguous gel monolith (e.g., a contiguous polymeric gel monolith as described herein). FIG. 12 shows a schematic drawing of 96 separation media arranged in a planar array of 8 parallel lanes, with each lane containing 12 contiguous separation media in series.

Figure 2:
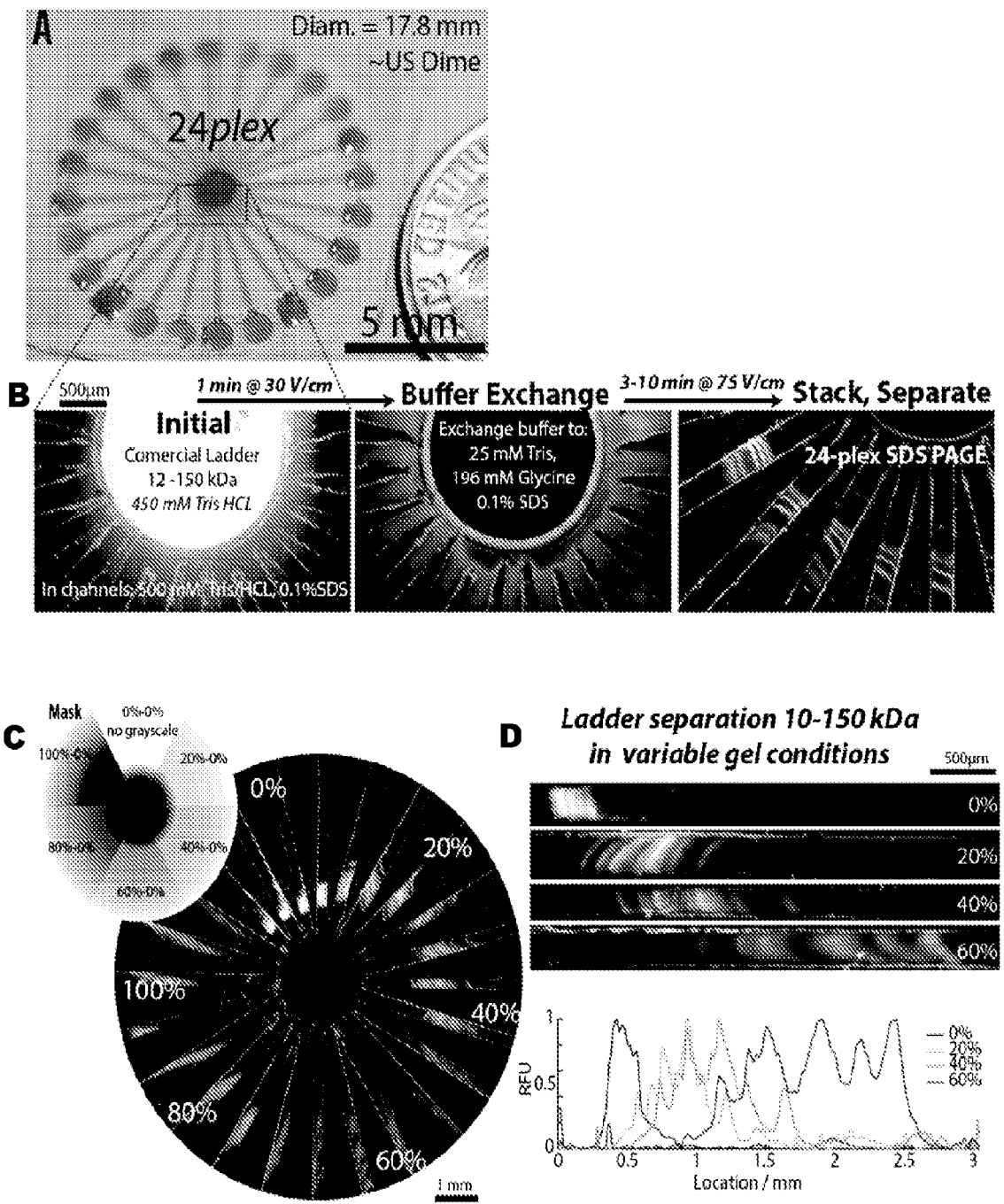
FIG. 2A shows an image of a 24-plex circular microfluidic device in the area of a US dime.
FIG. 2B shows images of the 24 channel injection, which proceeded as follows: sample was added to a central reservoir and an electric potential was applied uniformly towards the outer reservoirs causing sample to migrate into the channels. After loading, the remaining sample in the central reservoir was replaced with Tris/Glycine buffer. Due to the conductivity difference between Tris/Glycine and the samples, Tris/HCl buffer transient isotachophoresis occurred resulting in sample stacking initially and then a separation in each channel.
FIG. 2C shows images of an angularly varied grayscale mask was used to differentially pattern channels within the circular chip. A fluorescent SDS PAGE ladder was separated in all channels to determine the optimal gel conditions.
FIG. 2D shows images of the 60% to 0% gradient, which demonstrated a separation, with incomplete gel polymerization observed for the 80% and 100% gel gradients.

In certain embodiments, the array of separation media may be arranged in a radial arrangement of separation media. The radial arrangement of separation media may include a plurality of elongated separation media. In some cases, one end of each separation medium is in fluidic communication with a central well. The central well may be configured to contain a sample to be analyzed in the radial arrangement of separation media. FIG. 2A shows an image of a radial arrangement of elongated separation media, each with one end in fluidic communication with a central well.

Aspects of the systems include that the microfluidic devices may be configured to consume a minimum amount of sample while still producing detectable results. For example, the system may be configured to use a sample volume of 100 µL or less, such as 75 µL or less, including 50 µL or less, or 25 µL or less, or 10 µL or less, for example, 5 µL or less, 2 µL or less, or 1 µL or less while still producing detectable results. In certain embodiments, the system is configured to have a detection sensitivity of 1 nM or less, such as 500 µM or less, including 100 µM or less, for instance, 1 µM or less, or 500 fM or less, or 250 fM or less, such as 100 fM or less, including 50 fM or less, or 25 fM or less, or 10 fM or less. In some instances, the system is configured to be able to detect analytes at a concentration of 1 µg/mL or less, such as 500 ng/mL or less, including 100 ng/mL or less, for example, 10 mg/mL or less, or 5 ng/mL or less, such as 1 ng/mL or less, or 0.1 ng/mL or less, or 0.01 ng/mL or less, including 1 pg/mL or less. In certain embodiments, the system has a dynamic range from $10^{-18}$ M to 10 M, such as from $10^{-15}$ M to $10^{-3}$ M, including from $10^{-12}$ M to $10^{-6}$ M.

In some cases, the system is configured to have a signal-to-noise ratio (SNR) of 10 or more, such as 15 or more, including 20 or more, or 30 or more, or 40 or more, or 50 or more, or 60 or more, or 70 or more, or 80 or more, or 90 or more, or 100 or more, or 150 or more, or 200 or more, or 500 or more, or 1,000 or more, or 2,000 or more, or 3,000 or more, or 4,000 or more, or 5,000 or more, or 6,000 or more, or 7,000 or more, or 8,000 or more, or 9,000 or more, or 10,000 or more. In some cases, the achievable signal-to-noise ratio depends on the method of detection used in the assay. For example, in certain embodiments the analyte of interest is directly labeled with a detectable label. In these embodiments, the signal-to-noise ratio may be 10 or more, such as 15 or more, including 20 or more, or 30 or more, or 40 or more, or 50 or more, or 60 or more, or 70 or more, or 80 or more, or 90 or more, or 100 or more, or 150 or more, or 200 or more. In other embodiments, the analyte of interest is first labeled with a primary label (e.g., a primary antibody) and then the primary label is labeled with a secondary label (e.g., a secondary antibody). In these embodiments, the signal-to-noise ratio may be 100 or more, such as 150 or more, including 200 or more, or 500 or more, or 1,000 or more, or 2,000 or more, or 3,000 or more, or 4,000 or more, or 5,000 or more, or 6,000 or more, or 7,000 or more, or 8,000 or more, or 9,000 or more, or 10,000 or more.

In certain embodiments, the microfluidic devices are operated at a temperature ranging from 1° C. to 100° C., such as from 5° C. to 75° C., including from 10° C. to 50° C., or from 20° C. to 40° C. In some instances, the microfluidic devices are operated at a temperature ranging from 35° C. to 40° C.

Utility

In certain embodiments, the devices, systems and methods of the present disclosure find use the fabrication of photopolymerized separation media, such as for example photopolymerized polyacrylamide gels. For example, the devices, systems and methods of the present disclosure find use in the fabrication of photopolymerized separation media (e.g., polyacrylamide gels) for use in high-throughput electrophoretic separations. In some embodiments, the devices, systems and methods of the present disclosure facilitate the fabrication of photopolymerized separation media (e.g., polyacrylamide gels) having regions with different degrees of polymerization. For instance, the devices, systems and methods of the present disclosure facilitate the fabrication of photopolymerized separation media having regions with different densities (e.g., porosities). In certain instances, the devices, systems and methods of the present disclosure find use in the fabrication of photopolymerized devices, systems and methods of the present disclosure facilitate the fabrication of photopolymerized separation media having regions with different degrees of polymerization from a homogeneous separation medium precursor solution (e.g., polyacrylamide gel precursor solution) using a single exposure to light.

The subject devices, systems and methods find use in a variety of different applications where determination of the presence or absence, and/or quantification of one or more analytes in a sample is desired. In certain embodiments, the methods are directed to the detection of nucleic acids, proteins, or other biomolecules in a sample. The methods may include the detection of a set of biomarkers, e.g., two or more distinct protein biomarkers, in a sample. For example, the methods may be used in the rapid, clinical detection of two or more disease biomarkers in a biological sample, e.g., as may be employed in the diagnosis of a disease condition in a subject, in the ongoing management or treatment of a disease condition in a subject, etc. In addition, the subject devices, systems and methods may find use in protocols for the detection of an analyte in a sample, such as, but not limited to, Western blotting, Southern blotting, Northern blotting, Eastern, Far-Western blotting, Southwestern blotting, and the like.

In certain embodiments, the subject devices, systems and methods find use in detecting biomarkers. In some cases, the subject devices, systems and methods may be used to detect the presence or absence of particular biomarkers, as well as an increase or decrease in the concentration of particular biomarkers in blood, plasma, serum, or other bodily fluids or excretions, such as but not limited to urine, blood, serum, plasma, saliva, semen, prostatic fluid, nipple aspirate fluid, lachrymal fluid, perspiration, feces, cheek swabs, cerebrospinal fluid, cell lysate samples, amniotic fluid, gastrointestinal fluid, biopsy tissue (e.g., samples obtained from laser capture microdissection (LCM)), and the like.

The presence or absence of a biomarker or significant changes in the concentration of a biomarker can be used to diagnose disease risk, presence of disease in an individual, or to tailor treatments for the disease in an individual. For example, the presence of a particular biomarker or panel of biomarkers may influence the choices of drug treatment or administration regimes given to an individual. In evaluating potential drug therapies, a biomarker may be used as a surrogate for a natural endpoint such as survival or irreversible morbidity. If a treatment alters the biomarker, which has a direct connection to improved health, the biomarker can serve as a surrogate endpoint for evaluating the clinical benefit of a particular treatment or administration regime. Thus, personalized diagnosis and treatment based on the particular biomarkers or panel of biomarkers detected in an individual are facilitated by the subject devices, systems and methods. Furthermore, the early detection of biomarkers associated with diseases is facilitated by the high sensitivity of the subject devices and systems, as described above. Due to the capability of detecting multiple biomarkers on a single chip, combined with sensitivity, scalability, and ease of use, the presently disclosed microfluidic devices, systems and methods finds use in portable and point-of-care or near-patient molecular diagnostics.

In certain embodiments, the subject devices, systems and methods find use in detecting biomarkers for a disease or disease state. In some cases, the disease is a cellular proliferative disease, such as but not limited to, a cancer, a tumor, a papilloma, a sarcoma, or a carcinoma, and the like. In certain instances, the subject devices, systems and methods find use in detecting biomarkers for the characterization of cell signaling pathways and intracellular communication for drug discovery and vaccine development. For example, the subject devices, systems and methods find use in detecting the presence of a disease, such as a cellular proliferative disease, such as a cancer, tumor, papilloma, sarcoma, carcinoma, or the like. In certain instances, particular biomarkers of interest for detecting cancer or indicators of a cellular proliferative disease include, but are not limited to the following: prostate specific antigen (PSA), which is a prostate cancer biomarker; C-reactive protein, which is an indicator of inflammation; transcription factors, such as p53, which facilitates cell cycle and apoptosis control; polyamine concentration, which is an indicator of actinic keratosis and squamous cell carcinoma; proliferating cell nuclear antigen (PCNA), which is a cell cycle related protein expressed in the nucleus of cells that are in the proliferative growth phase; growth factors, such as IGF-I; growth factor binding proteins, such as IGFBP-3; micro-RNAs, which are single-stranded RNA molecules of about 21-23 nucleotides in length that regulate gene expression; carbohydrate antigen CA19.9, which is a pancreatic and colon cancer biomarker; cyclin-dependent kinases; epithelial growth factor (EGF); vascular endothelial growth factor (VEGF); protein tyrosine kinases; over-expression of estrogen receptor (ER) and progesterone receptor (PR); and the like. For example, the subject devices, systems and methods may be used to detect and/or quantify the amount of endogenous prostate specific antigen (PSA) in diseased, healthy and benign samples.

In certain embodiments, the subject devices, systems and methods find use in detecting biomarkers for an infectious disease or disease state. In some cases, the biomarkers can be molecular biomarkers, such as but not limited to proteins, nucleic acids, carbohydrates, small molecules, and the like. For example, the subject devices, systems and methods may be used to monitor HIV viral load and patient CD4 count for HIV/AIDS diagnosis and/or therapy monitoring by functionalizing the sensor surface with antibodies to HIV capsid protein p24, glycoprotiens 120 and 41, CD4+ cells, and the like. Particular diseases or disease states that may be detected by the subject devices, systems and methods include, but are not limited to, bacterial infections, viral infections, increased or decreased gene expression, chromosomal abnormalities (e.g. deletions or insertions), and the like. For example, the subject devices, systems and methods can be used to detect gastrointestinal infections, such as but not limited to, aseptic meningitis, botulism, cholera, *E. coli* infection, hand-foot-mouth disease, helicobacter infection, hemorrhagic conjunctivitis, herpangina, myocaditis, paratyphoid fever, polio, shigellosis, typhoid fever, vibrio septicemia, viral diarrhea, etc. In addition, the subject devices, systems and methods can be used to detect respiratory infections, such as but not limited to, adenovirus infection, atypical pneumonia, avian influenza, swine influenza, bubonic plague, diphtheria, influenza, measles, meningococcal meningitis, mumps, parainfluenza, pertussis (i.e., whooping cough), pneumonia, pneumonic plague, respiratory syncytial virus infection, rubella, scarlet fever, septicemic plague, severe acute respiratory syndrome (SARS), tuberculosis, etc. In addition, the subject devices, systems and methods can be used to detect neurological diseases, such as but not limited to, Creutzfeldt-Jakob disease, bovine spongiform encephalopathy (i.e., mad cow disease), Parkinson's disease, Alzheimer's disease, rabies, etc. In addition, the subject devices, systems and methods can be used to detect urogenital diseases, such as but not limited to, AIDS, chancroid, Chlamydia, condyloma accuminata, genital herpes, gonorrhea, lymphogranuloma venereum, non-gonococcal urethritis, syphilis, etc. In addition, the subject devices, systems and methods can be used to detect viral hepatitis diseases, such as but not limited to, hepatitis A, hepatitis B, hepatitis C, hepatitis D, hepatitis E, etc. In addition, the subject devices, systems and methods can be used to detect hemorrhagic fever diseases, such as but not limited to, Ebola hemorrhagic fever, hemorrhagic fever with renal syndrome (HFRS), Lassa hemorrhagic fever, Marburg hemorrhagic fever, etc. In addition, the subject devices, systems and methods can be used to detect zoonosis diseases, such as but not limited to, anthrax, avian influenza, brucellosis, Creutzfeldt-Jakob disease, bovine spongiform encephalopathy (i.e., mad cow disease), enterovirulent *E. coli* infection, Japanese encephalitis, leptospirosis, Q fever, rabies, sever acute respiratory syndrome (SARS), etc. In addition, the subject devices, systems and methods can be used to detect arbovirus infections, such as but not limited to, Dengue hemorrhagic fever, Japanese encephalitis, tick-borne encephalitis, West Nile fever, Yellow fever, etc. In addition, the subject devices, systems and methods can be used to detect antibiotics-resistance infections, such as but not limited to, *Acinetobacter baumannii*, *Candida albicans*, *Enterococci* sp., *Klebsiella pneumoniae*, *Pseudomonas aeruginosa*, *Staphylococcus aureus*, etc. In addition, the subject devices, systems and methods can be used to detect vector-borne infections, such as but not limited to, cat scratch disease, endemic typhus, epidemic typhus, human ehrlichosis, Japanese spotted fever, louse-borne relapsing fever, Lyme disease, malaria, trench fever, Tsutsugamushi disease, etc. Similarly, the subject devices, systems and methods can be used to detect cardiovascular diseases, central nervous diseases, kidney failures, diabetes, autoimmune diseases, and many other diseases.

The subject device, systems and methods find use in diagnostic assays, such as, but not limited to, the following: detecting and/or quantifying biomarkers, as described above; screening assays, where samples are tested at regular intervals for asymptomatic subjects; prognostic assays, where the presence and or quantity of a biomarker is used to predict a likely disease course; stratification assays, where a subject's response to different drug treatments can be predicted; efficacy assays, where the efficacy of a drug treatment is monitored; and the like.

The subject devices, systems and methods also find use in validation assays. For example, validation assays may be used to validate or confirm that a potential disease biomarker is a reliable indicator of the presence or absence of a disease across a variety of individuals. The short assay times for the subject devices, systems and methods may facilitate an increase in the throughput for screening a plurality of samples in a minimum amount of time.

In some instances, the subject devices, systems and methods can be used without requiring a laboratory setting for implementation. In comparison to the equivalent analytic research laboratory equipment, the subject devices and systems provide comparable analytic sensitivity in a portable, hand-held system. In some cases, the weight and operating cost are less than the typical stationary laboratory equipment. The subject systems and devices may be integrated into a single apparatus, such that all the steps of the assay, including separation, transfer, labeling and detecting of an analyte of interest, may be performed by a single apparatus. For example, in some instances, there are no separate apparatuses for separation, transfer, labeling and detecting of an analyte of interest. In addition, the subject systems and devices can be utilized in a home setting for over-the-counter home testing by a person without medical training to detect one or more analytes in samples. The subject systems and devices may also be utilized in a clinical setting, e.g., at the bedside, for rapid diagnosis or in a setting where stationary research laboratory equipment is not provided due to cost or other reasons.

Kits

Aspects of the present disclosure additionally include kits that have a microfluidic device as described in detail herein. In certain embodiments, the kit includes a packaging configured to contain the device. The packaging may be a sealed packaging, such as a sterile sealed packaging. By "sterile" is meant that there are substantially no microbes (such as fungi, bacteria, viruses, spore forms, etc.). In some instances, the packaging may be configured to be sealed, e.g., a water vapor-resistant packaging, optionally under an air-tight and/or vacuum seal.

In certain embodiments, the kit includes a buffer. For instance, the kit may include a buffer, such as an electrophoretic buffer, a sample buffer, and the like. The kits may further include additional reagents, such as but not limited to, release agents, denaturing agents, refolding agents, detergents, detectable labels (e.g., fluorescent labels, colorimetric labels, chemiluminescent labels, multicolor reagents, enzyme-linked reagents, avidin-streptavidin associated detection reagents, radiolabels, gold particles, magnetic labels, etc.), and the like.

In addition to the above components, the subject kits may further include instructions for practicing the subject methods. These instructions may be present in the subject kits in a variety of forms, one or more of which may be present in the kit. One form in which these instructions may be present is as printed information on a suitable medium or substrate, e.g., a piece or pieces of paper on which the information is printed, in the packaging of the kit, in a package insert, etc. Another means would be a computer readable medium, e.g., CD, DVD, Blu-Ray, computer-readable memory (e.g., flash memory), etc., on which the information has been recorded or stored. Yet another means that may be present is a website address which may be used via the Internet to access the information at a removed site. Any convenient means may be present in the kits.

As can be appreciated from the disclosure provided above, embodiments of the present invention have a wide variety of applications. Accordingly, the examples presented herein are offered for illustration purposes and are not intended to be construed as a limitation on the invention in any way. Those of ordinary skill in the art will readily recognize a variety of noncritical parameters that could be changed or modified to yield essentially similar results. Thus, the following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Celsius, and pressure is at or near atmospheric.

EXAMPLES

Example 1

Experiments were performed to produce, characterize, and test a grayscale mask photopatterning process for producing complex lab-on-a-chip devices for performing protein measurement assays. Non-uniform hydrogels provide an avenue for integration of both preparative and analytical functions (e.g., sample enrichment, high-resolution biomolecular separations, and sample immobilization/capture).

Hydrogel photopatterning via laser-printed grayscale masks was used to controllably define non-uniform pore-size distributions from a single <60 s UV exposure and acrylamide precursor solution. Grayscale photopatterning was used to produce bioanalytical electrophoresis gels. The process allowed a rapid-turnaround of 15 min from device concept to production. (See, e.g., FIGS. 1A-1C). In some cases, the resolution limit of the printed grayscale dot patterns on the photomask itself was about 30-80 μm dots. (FIG. 1B). A light diffuser was included in the UV light path, thus allowing for the fabrication of linear density gel-gradients from about 5%-40%.

Example 2

Experiments were performed using two analytical electrophoresis devices. The first was a 24-plex electrophoresis screening assay (FIGS. 2A-2D). From a single injection, a sample was assayed under 24 discrete gel conditions in a lab-on-a-chip device. The second device included a 96-plex gradient gel-based protein sizing assay (FIGS. 3A-3D) in a free-standing polyacrylamide gel platform. FIG. 12 shows a schematic drawing of a 96-plex gradient gel-based separation device that includes an array of 8 parallel lanes of 12 gradient separation media arranged in series. The black squares of each gradient separation gel represent the sample loading well.

The 24-plex electrophoresis screening assay was a small circular chip (diameter of a US dime) containing 24 radial channels with a shared central reservoir. For operation, a sample was injected from the central reservoir as a discrete zone into all 24 radial channels using transient isotachophoresis. To produce different gel conditions, a grayscale mask was used to vary gel density angularly in six distinct regions (FIG. 2C). A wide-size range protein ladder was run through each of the 24 radial channels. A 60%-0% gradient gel was identified as the optimal separation condition.

Figure 3:
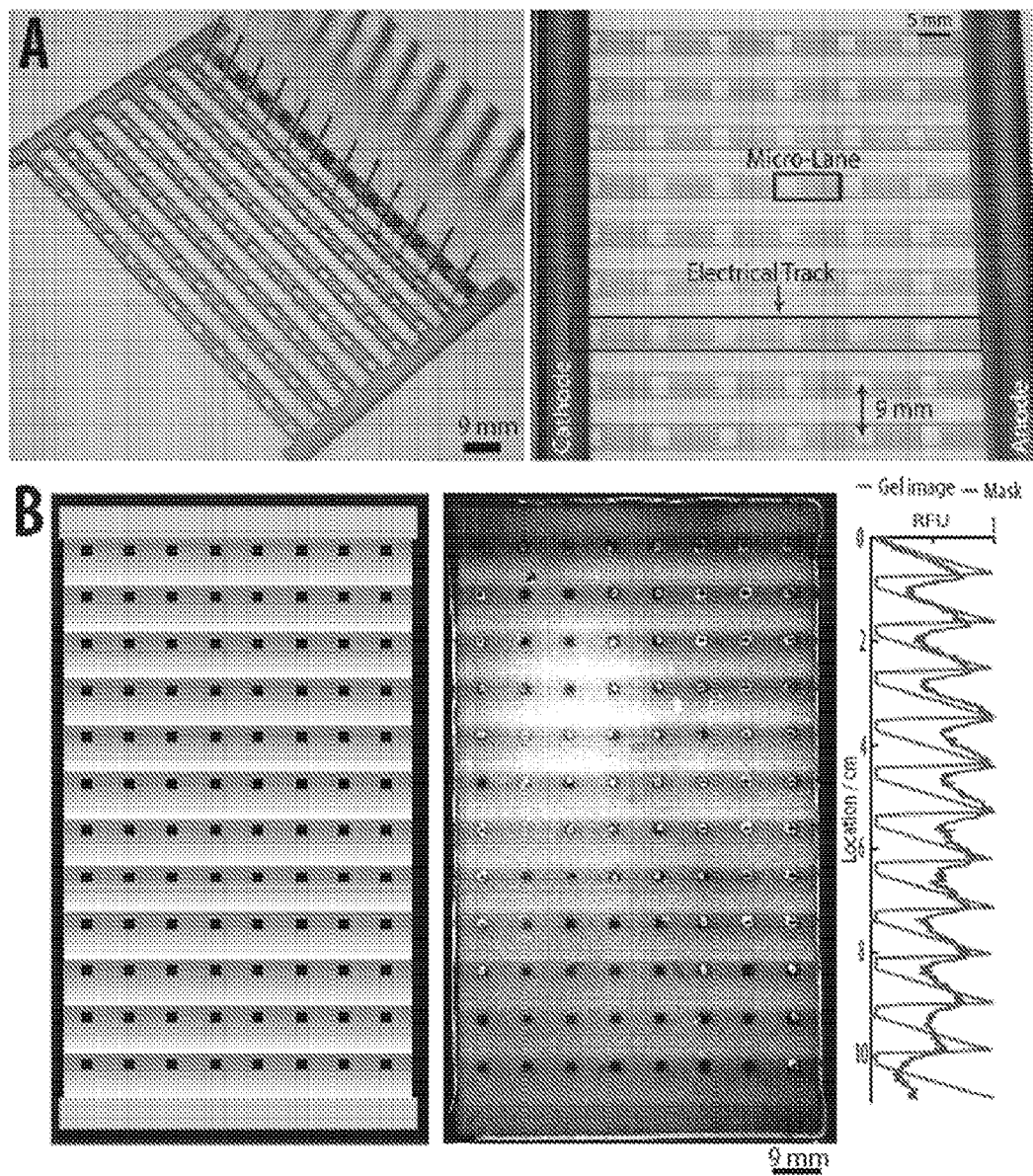
FIGS. 3A-3D show images of a 96-plex SDS PAGE gradient gel separation that was performed for high resolution protein sizing within a large array.
Figure 3:
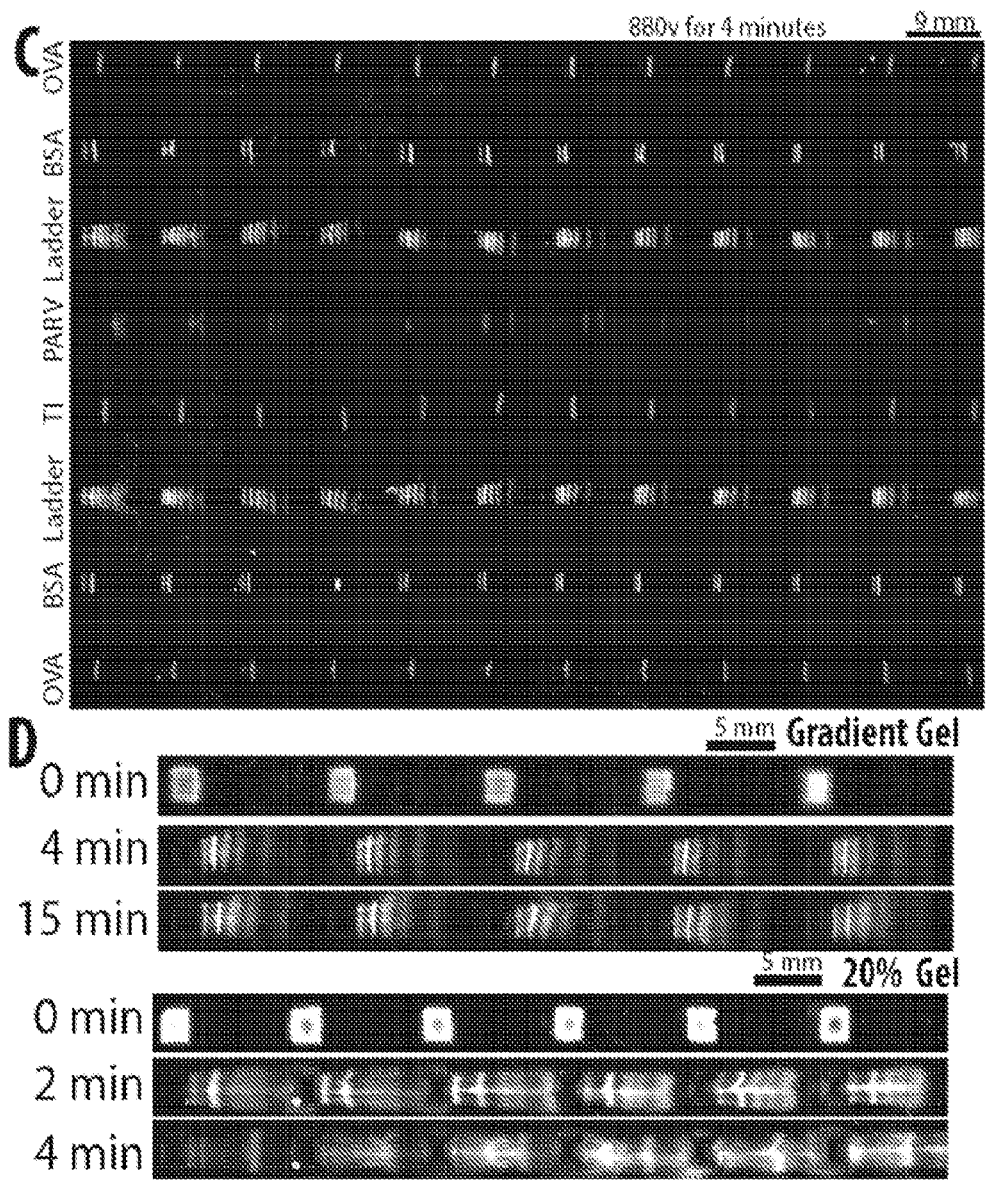

The 96-plex gradient free-standing gel-based protein sizing assay was produced using a free-standing polyacrylamide gel. A 96-plex free-standing gel array was produced that included non-uniform gel conditions and a decreasing pore-size hydrogel gradient to prevent migration of sample species into adjacent lanes. This decreasing pore-size hydrogel gradient allowed densely arrayed separation gels with contiguous, but distinct separation lanes on one device. Using the present non-uniform pore-size grayscale photomask production method, a 96-plex protein sizing (non-native) assay using free-standing gradient gel separations was performed (FIG. 3C). The protein peaks were clearly resolved in 4 min of electrophoresis. Using the gradient gel, observed no contamination from neighboring lanes was observed, even after a 15 min separation.

The methods for rapidly producing non-uniform hydrogel density, closed-channel and free-standing hydrogel microfluidic geometries find use in the development and optimization of novel analytical tools for high-throughput proteomics.

Example 3

Fabrication of a Chrome Grayscale for 1 mm or Less Spatial Patterning

To produce a grayscale mask for controllably attenuating light over short length scales (e.g., 1 mm or less), a mask with small binary features was used to produce the desired UV pattern. A chrome mask was produced using the grayscale production strategy (see FIG. 13) to produce masks that minimized the largest feature of the mask (i.e., to minimize the largest opaque feature of the mask). Minimization of the largest feature of the mask facilitated a reduction in micro-patterning (i.e., pixilation) from the grayscale mask instead of UV attenuation. The opaque features of the mask include chrome.

Figure 13:
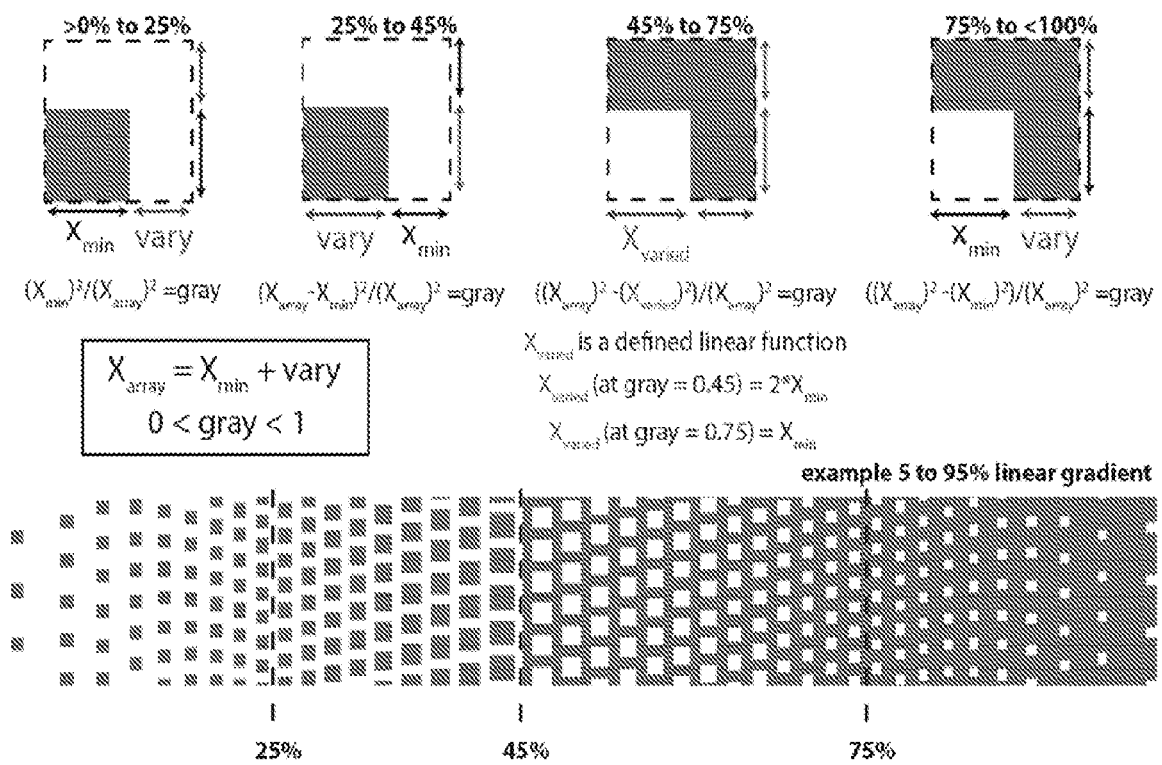
FIG. 13 (top) shows drawings and accompanying formulae for determining the size of opaque features of a grayscale mask for >0% to 25% grayscale, 25% to 45% grayscale, 45% to 75% grayscale, and 75% to <100% grayscale, according to embodiments of the present disclosure.

FIG. 13 (top) shows drawings and accompanying formulae for determining the size of opaque features of a grayscale mask for 0% to 25% grayscale, 25% to 45% grayscale, 45% to 75% grayscale, and 75% to 100% grayscale, according to embodiments of the present disclosure. FIG. 13 (bottom) shows a drawing of an example of a 5% to 95% linear gradient grayscale mask. For >0% to 25% grayscale, $(X_{min})^2/(X_{array})^2$=grayscale. For 25% to 45% grayscale, $(X_{array}-X_{min})^2/(X_{array})^2$=grayscale. For 45% to 75% grayscale, $(X_{array})^2-(X_{varied})^2/(X_{array})^2$=grayscale. For 75% to <100% grayscale, $(X_{array})^2-(X_{min})^2/(X_{array})^2$=grayscale. $X_{varied}$ is a defined linear function; $X_{varied}$(at grayscale=0.45)=$2*X_{min}$, and $X_{varied}$(at grayscale=0.75)=$X_{min}$. In addition, $X_{array}=X_{min}+X_{varied}$, with 0<grayscale<1.

Example 4

A chrome linear gradient grayscale mask for 1 mm spatial patterning is shown in FIG. 14A. As shown in FIG. 14A, the linear gradient was from 20% to 80% grayscale. FIG. 14B (top) shows an image of two 20% to 80% grayscale masks with the image taken through a 2× objective lens and focused on the masks. FIG. 14B (bottom) shows an image of one 20% to 80% grayscale mask with the image taken through a 10× objective lens and focused on the mask. FIG. 14C (top) shows an image of two 20% to 80% grayscale masks with the image taken through a 2× objective lens and focused 1 mm above the masks. FIG. 14C (bottom) shows an image of one 20% to 80% grayscale mask with the image taken through a 10× objective lens and focused 1 mm above the mask. Due the small maximum features size on the grayscale mask, at 1 mm from the mask, light diffraction has eliminated the mask micropattern to produce smooth intensity attenuated gradients (see FIG. 14C). This linear gradient grayscale mask for 1 mm spatial patterning may be used to produce a gradient gel for single cell analysis.

Grayscale Single Cell Analysis Fabrication Setup

Figure 15:
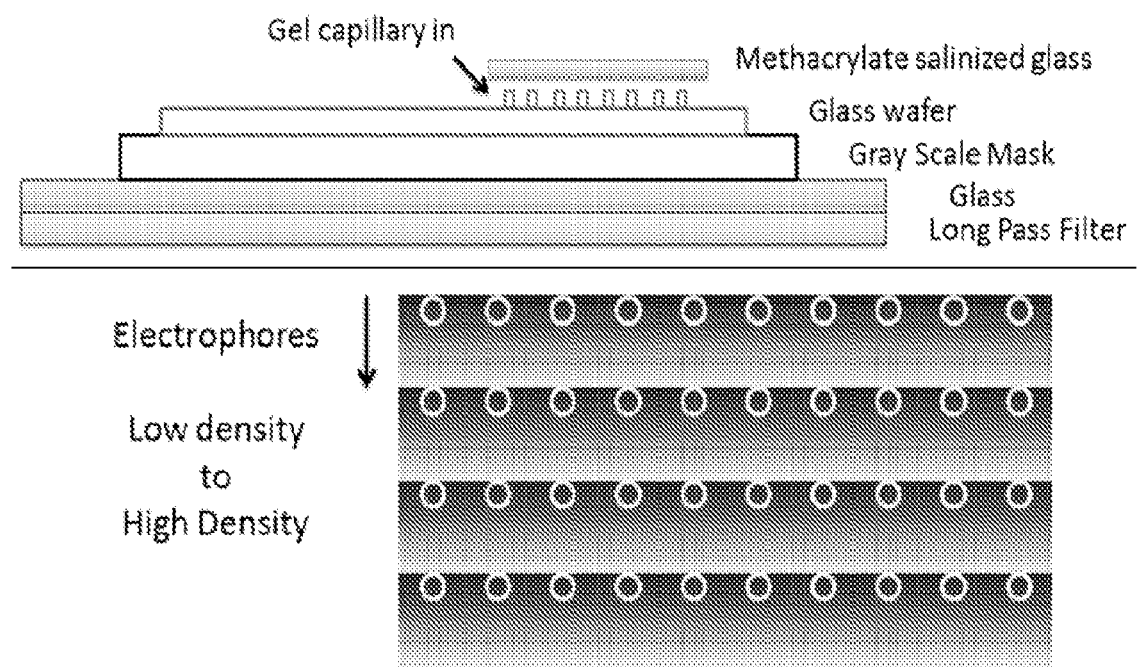
FIG. 15 shows a schematic drawing of a fabrication setup for producing a grayscale gel for single cell analysis, according to embodiments of the present disclosure.

FIG. 15 shows a schematic drawing of a fabrication setup for producing a grayscale gel for single cell analysis. The fabrication setup for producing a grayscale gel for single cell analysis included the following components: a long pass filter; a grayscale mask; a transparent mold with micro features (e.g., pillars on the mold for producing sample loading wells in the gel); and a methacrylate salinized glass slide (see FIG. 15, top). The long pass filter (390 nm cutoff) was placed in the UV light path to minimize benzophenone activation during photopatterning. The gel precursor solution contained benzophenone methacrylate, acrylamide, methylene bis-acrylamide and a photoinitiator (e.g., VA086, which is a non-nitrile nonionic halogen-free azo initiator, 2,2'-azobis[2-methyl-N-(2-hydroxyethyl)propionamide]). The gel precursor solution was confined between the transparent mold and the methacrylate salinized slide. The pillars on the mold (which dictated the well locations, as shown by the circles in FIG. 15, bottom) were aligned to the desired location along the grayscale mask and then UV exposure was performed for a controlled amount of time.

Example 5

Gradient Gel Visualization

Figures 16A, 16B:
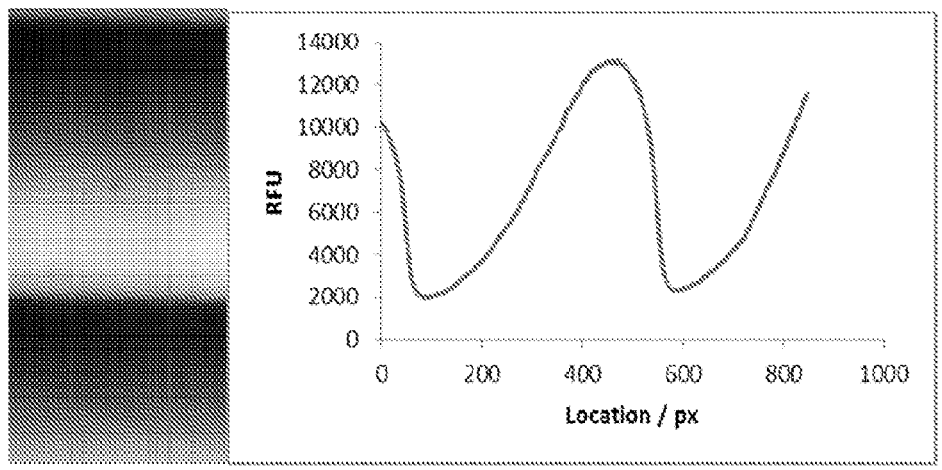
FIG. 16A shows a fluorescence image of a gradient gel, which shows the gradient in gel density.
FIG. 16B shows a graph of relative fluorescence units (RFU) vs. location (pixels) for the gradient gel, according to embodiments of the present disclosure.
Figure 17A:
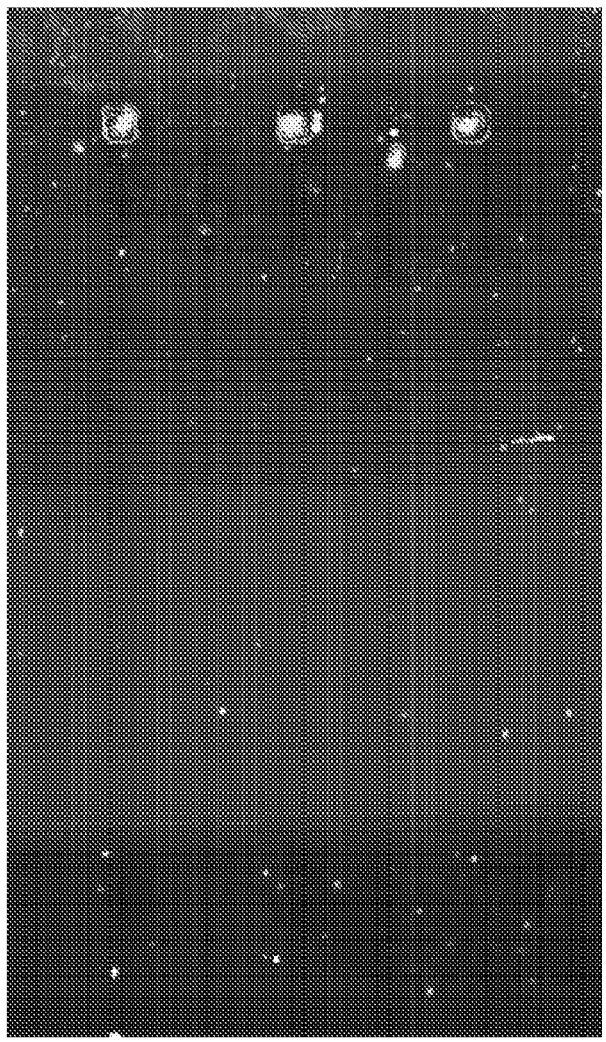
FIG. 17A shows an image of U373 GFP expressing cells in microwells on a gradient gel as visualized by TRITC fluorophore, according to embodiments of the present disclosure.
Figure 17B:
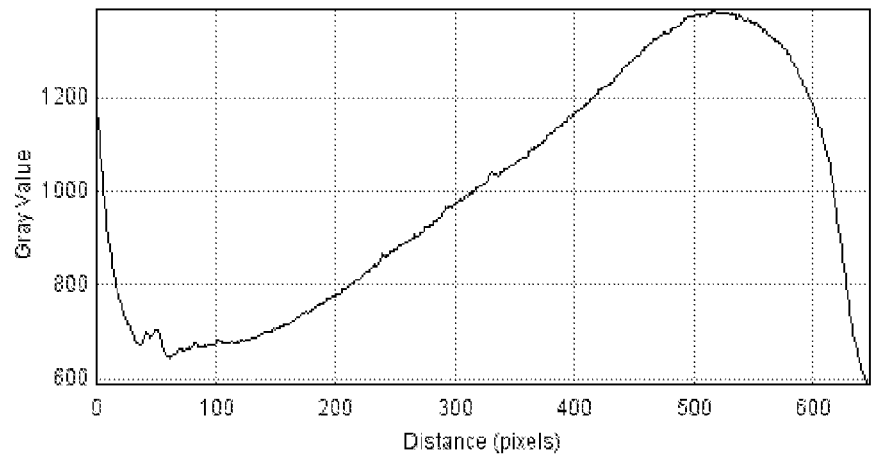
FIG. 17B shows a corresponding graph of grayscale value vs. distance (pixels).

To visualize gel density, allylamine was incorporated into the precursor solution at a 1:100 (mol:mol) ratio to acrylamide. The gels were then soaked in fluorescein isothiocyanate (FITC; isomer I) or tetramethylrhodamine (TRITC; G Isomer) in water, to react with the primary amine on allylamine, which served as a proxy for determining gel density. The image below demonstrates a 1 mm gradient gel using a FITC fluorophore. FIG. 16A shows a fluorescence image of a gradient gel, which shows the gradient in gel density. FIG. 16B shows a graph of relative fluorescence units (RFU) vs. location (pixels) for the gradient gel. FIG. 17A shows an image of U373 GFP expressing cells in microwells on a gradient gel as visualized by TRITC fluorophore. FIG. 17B shows a corresponding graph of grayscale value vs. distance (pixels).

Example 6

Gradient Gel Characterization

U373-GFP expressing cells were seeded in a gradient polyacrylamide gel (PAG), and for comparison a uniform polyacrylamide gel. The gradient gel was fabricated as described herein using 25% T, 3.3% C, and UV 27.5 mW/cm$^2$ for 110 s to produce a 90% to 10% grayscale gradient PAG. The uniform gel was fabricated using 20% T.

Figure 18:
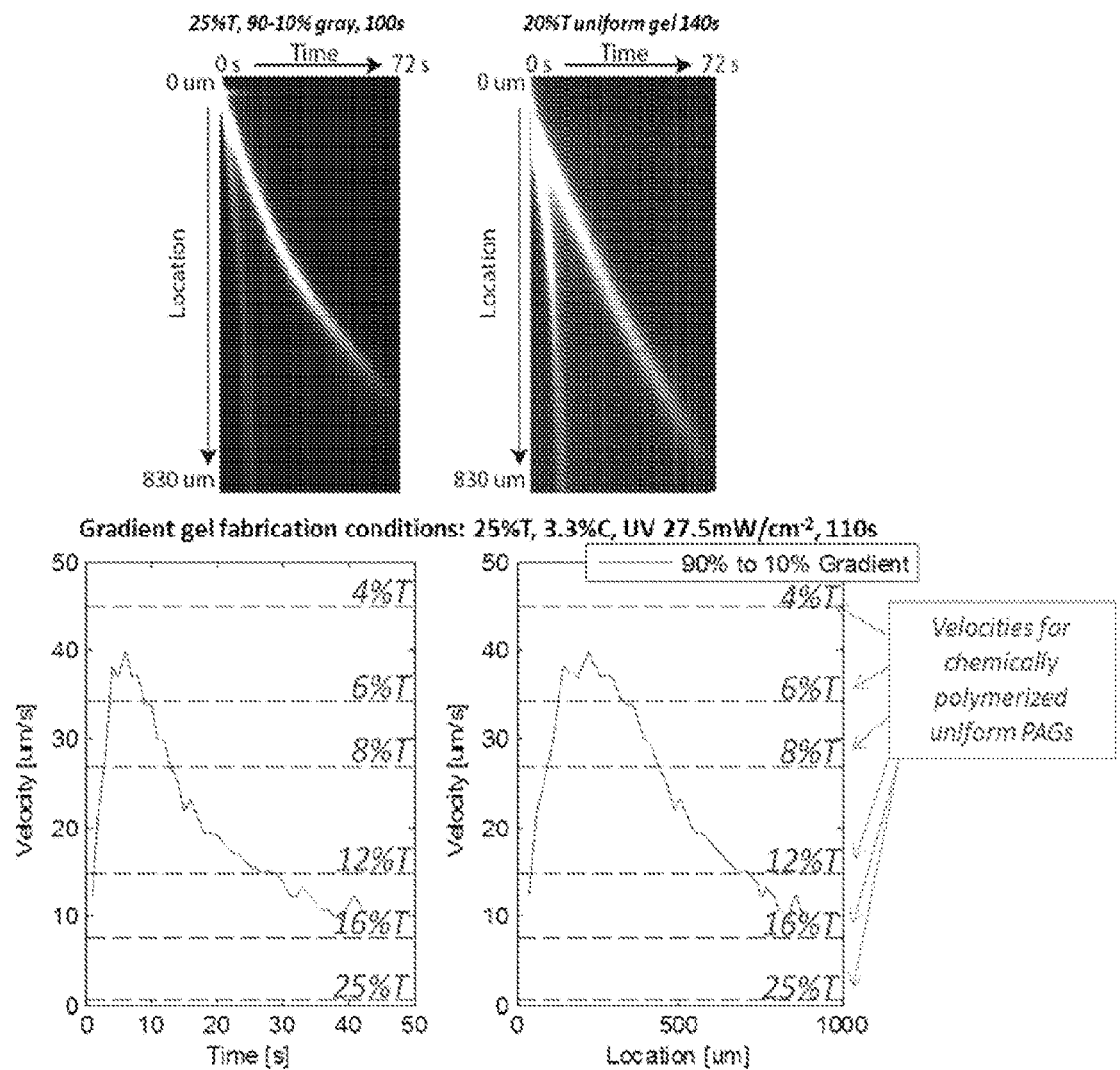
FIG. 18 (top left) shows a fluorescence image of analyte migration through a 90% to 10% gradient polyacrylamide gel (PAG), according to embodiments of the present disclosure.

The cells were lysed and GFP migration was assessed with epi-fluorescence imaging. The GFP species in the gradient gel showed a non-linear migration indicative of the gradient nature of the grayscale patterned PAG (see FIG. 18 (top left)). FIG. 18 (top left) shows a fluorescence image of analyte migration through the above described gradient PAG. Uniform PAGs demonstrated a linear migration (see FIG. 18 (top right). FIG. 18 (top right) shows a fluorescence image of analyte migration through the uniform PAG. To characterize the variation of gel size over a gradient gel, the spatial and temporal variation of GFP migration was compared to the velocities observed in a uniform gel. FIG. 18 (bottom left) shows a graph of velocity (μm/s) vs. time (s) for the above described gradient PAG, and FIG. 18 (bottom right) shows a graph of velocity (μm/s) vs. location (μm) for the above described gradient PAG. Dotted lines indicate the corresponding values for uniform PAGs with the % T as indicated.

The gradient gel showed a large range of velocities—at its fastest velocities larger than those experienced in a 6% T uniform PAG and at its slowest slower than those experienced in a 12% T uniform PAG.

Example 7

Single Cell Western Blotting in Gradient PAGs

Figures 19A, 19B, 19C:
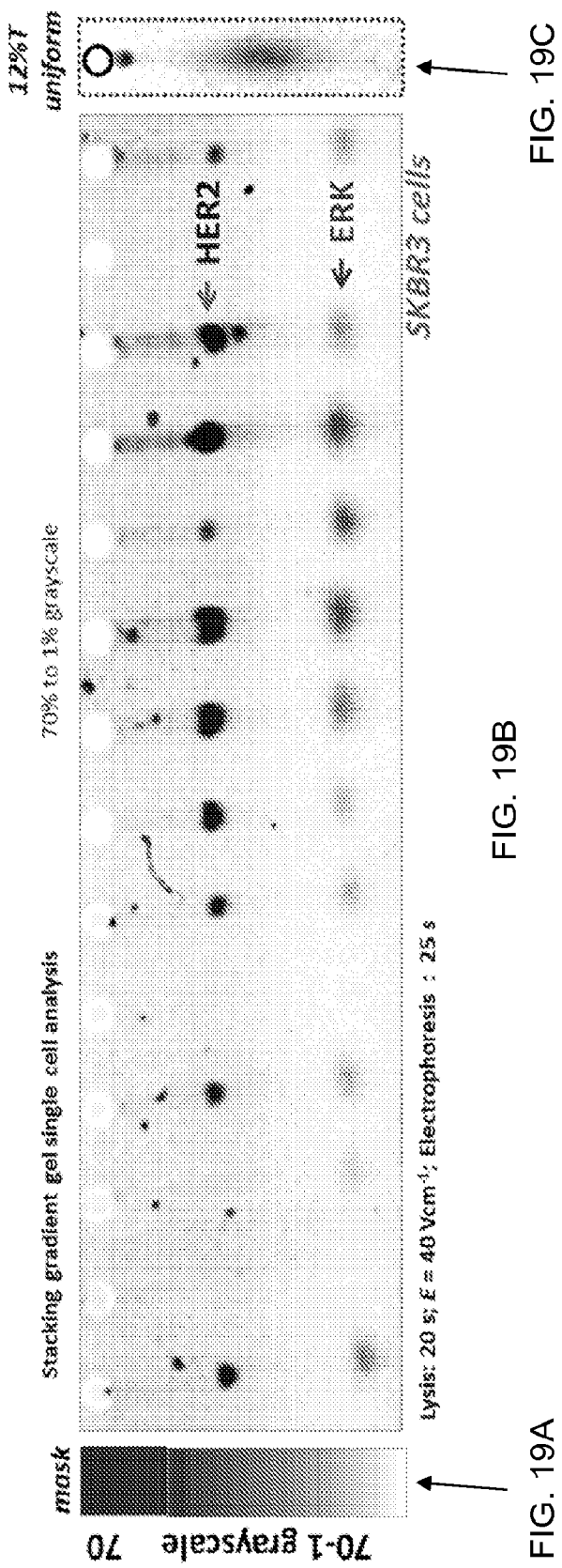
FIG. 19A shows an image of a photomask pattern that included a 300 $\mu$m long uniform 70% grayscale region, and a 70% to 1% grayscale region between 300 $\mu$m to 1 mm, according to embodiments of the present disclosure.
FIG. 19B shows a fluorescence image of analyte separation in the 70% to 1% gradient gel.
FIG. 19C shows a fluorescence image of analyte separation in a 12% T uniform gel.

Single cell western blotting was performed on SKBR3 cells using a grayscale photo-patterned polyacrylamide gel (PAG), and was compared to a uniform gel. The photomask pattern included a 300 μm long uniform 70% grayscale region (to produce a stacking region in the gel), and a 70% to 1% grayscale region between 300 μm to 1 mm to produce a gradient gel separation region in the gel (see FIG. 19A). A 12% T precursor solution was used with a UV exposure time of 145 seconds to produce the gradient gel. The gradient gel was compared to 12% T chemically polymerized uniform polyacrylamide gel. Cells were applied to the gel and after cell settling in the sample loading wells, lysis (20 s), and electrophoresis (E=40 Vcm$^{-1}$, 25 s) of the proteins was performed. Analytes were captured by attachment to reactive benzophenone groups in the PAG initiated by UV light. The gels were probed for HER2 and ERK, and the resultant probing results are shown in FIG. 19B. FIG. 19B shows a fluorescence image of analyte separation in the 70% to 1% gradient gel. The gradient gel produced using a grayscale mask showed a significant improvement in the separation of the analytes as compared to the uniform gel. FIG. 19C shows a fluorescence image of analyte separation in the uniform gel.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular embodiments only, and is not intended to be limiting, since the scope of the present invention will be limited only by the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

That which is claimed is:

1. A method for producing a spatially varied separation medium, the method comprising:
   exposing a separation medium precursor solution to light from a light source through a photomask to produce a separation medium,
   wherein the photomask comprises a semi-transparent region with varied light transmittance comprising a pattern of opaque regions and optically transmissive regions,
   wherein an optically transmissive region is positioned between opaque regions, wherein an opaque region is positioned between optically transmissive regions,
   wherein the separation medium has a density gradient, and
   wherein the separation medium precursor solution comprises an acrylamide monomer or derivative thereof, a crosslinker, and a photoinitiator.

2. The method of claim 1, further comprising directing the light from the light source through a light diffuser between the photomask and the separation medium precursor solution.

3. The method of claim 1, wherein the photomask comprises two or more regions having a different light transmittance.

4. The method of claim 1, wherein a region of the photomask has a light transmittance ranging from 10% and 90%.

5. The method of claim 4, wherein a region of the photomask has a light transmittance ranging from 40% and 90%.

6. The method of claim 1, wherein the photomask has a linear gradient of light transmittance from 0% to 100%.

7. The method of claim 6, wherein the photomask has a linear gradient of light transmittance from 10% to 90%.

* * * * *